United States Patent
Dikarev et al.

(10) Patent No.: US 11,233,529 B2
(45) Date of Patent: Jan. 25, 2022

(54) TECHNIQUES FOR EMPLOYING POLAR CODE IN CONNECTION WITH NR (NEW RADIO)

(71) Applicant: Apple Inc., Cupertino, CA (US)

(72) Inventors: Dmitry Dikarev, Nizhny Novgorod (RU); Grigory Ermolaev, Nizhny Novgorod (RU); Ajit Nimbalker, Fremont, CA (US); Alexei Davydov, Nizhny Novgorod (RU); Ashwin Chandrasekaran, Santa Clara, CA (US); Sathishkumar Chellakuhigounder Kulandaivel, San Jose, CA (US)

(73) Assignee: Apple Inc., Cupertino, CA (US)

( * ) Notice: Subject to any disclaimer, the term of this patent is extended or adjusted under 35 U.S.C. 154(b) by 55 days.

(21) Appl. No.: 16/488,309

(22) PCT Filed: Mar. 22, 2018

(86) PCT No.: PCT/US2018/023745
§ 371 (c)(1),
(2) Date: Aug. 23, 2019

(87) PCT Pub. No.: WO2018/175711
PCT Pub. Date: Sep. 27, 2018

(65) Prior Publication Data
US 2020/0007161 A1 Jan. 2, 2020

Related U.S. Application Data

(60) Provisional application No. 62/476,400, filed on Mar. 24, 2017, provisional application No. 62/588,263, filed on Nov. 17, 2017.

(51) Int. Cl.
*H03M 13/00* (2006.01)
*H03M 13/13* (2006.01)
(Continued)

(52) U.S. Cl.
CPC .......... *H03M 13/13* (2013.01); *H03M 13/09* (2013.01); *H03M 13/2703* (2013.01); *H03M 13/2789* (2013.01); *H03M 13/6356* (2013.01)

(58) Field of Classification Search
None
See application file for complete search history.

(56) References Cited

U.S. PATENT DOCUMENTS 9,966,973 B2 * 5/2018 Li ................. H03M 13/155
10,554,224 B2 * 2/2020 Li ................. H03M 13/2957
(Continued)

FOREIGN PATENT DOCUMENTS

| EP | 0 856 949 A1 | 8/1998 |
| EP | 2 922 227 A1 | 9/2015 |

OTHER PUBLICATIONS

K. G. Lenzi, J. A. B. Filho and F. A. P. Figueiredo, "Code block segmentation hardware architecture for LTE-Advanced," 2013 IEEE Wireless Communications and Networking Conference (WCNC), 2013, pp. 3312-3317, doi: 10.1109/WCNC.2013.6555094. (Year: 2013).*

(Continued)

*Primary Examiner* — Daniel F. McMahon
(74) *Attorney, Agent, or Firm* — Eschweiler & Potashnik, LLC

(57) ABSTRACT

One example aspect of the techniques discussed herein is a User Equipment (UE) comprising processing circuitry configured to determine one or more thresholds for code block segmentation, wherein the one or more thresholds for code block segmentation comprise one or more of a payload threshold (Kseg) or a code rate threshold (Rseg); determine to perform code block segmentation based on the one or more thresholds and at least one of a current payload (K) of an information block or a current code rate (R) for the information block; segment the information block into a (Continued)

plurality of segments; and encode each segment of the plurality of segments via a polar encoder with a code size (N).

18 Claims, 17 Drawing Sheets

(51) Int. Cl.
  H03M 13/09 (2006.01)
  H03M 13/27 (2006.01)

(56) References Cited

U.S. PATENT DOCUMENTS

| | | | |
|---|---|---|---|
| 2016/0218743 A1* | 7/2016 | Li | H03M 13/611 |
| 2018/0048440 A1* | 2/2018 | Yang | H04L 5/0046 |
| 2018/0212624 A1* | 7/2018 | Li | H03M 13/2906 |
| 2020/0007161 A1* | 1/2020 | Dikarev | H03M 13/2789 |
| 2020/0235752 A1* | 7/2020 | Sandberg | H03M 13/6522 |
| 2021/0112528 A1* | 4/2021 | Lee | H04L 1/0072 |

OTHER PUBLICATIONS

K. Lenzi, F. A. P. Figueiredo, J. A. B. Filho and F. L. Figueiredo, "On the Performance of Code Block Segmentation for LTE-Advanced: An In-Depth Analysis," 2013 25th International Symposium on Computer Architecture and High Performance Computing, 2013, pp. 200-205, doi: 10.1109/SBAC-PAD.2013.25. (Year: 2013).*

International Preliminary Report on Patentability dated Sep. 24, 2019 for International Application No. PCT/US2018/023745.

International Search Report dated Sep. 3, 2018 for International Application No. PCT/US2018/023745.

"Code Block Segmentation for LDPC Codes." Source: Ericsson. Agenda Item: 8.1.4.1. 3GPP TSG-RAN WG1 #88, Athens, Greece, Feb. 13-17, 2017. R1-1701629.

"On construction of Polar codes." Source: ZTE, ZTE Microelectronics. Agenda Item: 8.1.4.2.1. 3GPP TSG RAN WG1 Meeting #88, Athens, Greece Feb. 13-17, 2017. R1-1701603.

"Interleaver design for Polar codes." Source: Qualcomm Incorporated. Agenda Item: 7.1.4.2.1.3. 3GPP TSG-RAN WG1 Meeting #89, May 15-19, 2017, Hangzhou, P.R. China. R1-1708649.

"WF on Mother Code Size of Polar Codes." Agenda item 8.1.4.2. Ericsson, Intel. InterDigital. LG, AT&T, Accelercomm. 3GPP TSG RAN WG1 Meeting #88, Athens, Greece, Feb. 13-17, 2017. R1-1703616.

* cited by examiner

| $K_P$ | 1/6 | 1/5 | 1/3 | 2/5 | 1/2 | 2/3 | 3/4 | 5/6 | 8/9 |
|---|---|---|---|---|---|---|---|---|---|
| 32 | 25 (27) | 22 (22) | 15 (15) | 10 | 4 | 3 | 3 | 1 | 2 |
| 40 | 50 (26) | 31 (25) | 20 (20) | 17 | 5 | 8 | 4 | 2 | 3 |
| 48 | 21 (35) | 43 (25) | 31 | 18 | 11 | 8 | 4 | 3 | 3 |
| 56 | 29 (28) | 58 (27) | 38 | 24 | 17 | 11 | 4 | 4 | 3 |
| 64 | 49 (73) | 64 (26) | 22 (22) | 25 | 19 | 11 | 5 | 4 | 3 |
| 72 | 58 (91) | 70 (80) | 26 (26) | 32 | 21 | 12 | 8 | 4 | 2 |
| 80 | 74 (91) | 92 (80) | 29 (29) | 40 | 24 | 13 | 10 | 4 | 4 |
| 88 | 90 (100) | 51 (84) | 41 | 49 | 30 | 18 | 11 | 4 | 4 |
| 96 | 99 (118) | 62 (80) | 43 | 54 | 31 | 19 | 13 | 6 | 5 |
| 100 | 102 (121) | 71 (79) | 47 | 52 | 32 | 18 | 14 | 7 | 5 |
| 104 | 106 (121) | 82 (101) | 54 | 32 | 33 | 19 | 14 | 7 | 5 |
| 112 | 123 (122) | 82 (109) | 55 | 65 | 38 | 22 | 13 | 8 | 5 |
| 120 | 138 (120) | 95 (112) | 56 | 78 | 47 | 24 | 15 | 7 | 5 |
| 128 | 152 (119) | 102 (104) | 81 (81) | 44 | 54 | 32 | 14 | 8 | 5 |
| 136 | 162 (125) | 110 (109) | 80 (80) | 86 | 57 | 33 | 15 | 9 | 5 |
| 144 | 179 (124) | 120 (105) | 89 (89) | 48 | 56 | 32 | 16 | 10 | 5 |
| 152 | 194 (126) | 134 (110) | 104 (104) | 53 | 58 | 20 | 18 | 11 | 4 |
| 160 | 204 (117) | 142 (107) | 112 (112) | 62 | 65 | 23 | 19 | 12 | 5 |
| 168 | 217 (224) | 156 (112) | 107 (107) | 66 | 70 | 24 | 24 | 11 | 5 |
| 176 | 239 (157) | 171 (104) | 122 | 70 | 70 | 24 | 26 | 12 | 6 |
| 184 | 250 (166) | 184 (222) | 126 | 86 | 74 | 31 | 29 | 13 | 8 |
| 192 | 267 (162) | 195 (213) | 138 | 102 | 85 | 33 | 30 | 13 | 8 |
| 200 | 276 | 200 | 139 | 107 | 90 | 34 | 34 | 15 | 8 |

FIG. 10

TECHNIQUES FOR EMPLOYING POLAR CODE IN CONNECTION WITH NR (NEW RADIO)

REFERENCE TO RELATED APPLICATIONS

This application is a National Phase entry application of International Patent Application No. PCT/US2018/023745 filed Mar. 22, 2018, which claims priority to U.S. Provisional Applications No. 62/476,400 filed Mar. 24, 2017, entitled "NEW RADIO (NR) POLAR CODE SUPPORT OF LARGE PAYLOADS" and 62/588,263 filed Nov. 17, 2017, entitled "SYSTEM AND METHOD FOR POLAR BLOCK CODE SEGMENTATION AND INTERLEAVING", and is hereby incorporated by reference in its entirety.

FIELD

The present disclosure relates to wireless technology, and more specifically to techniques for employing polar codes in connection with NR (New Radio) wireless communication systems.

BACKGROUND

Polar codes are error-correction codes that can achieve the capacity of some memoryless communication channels. Several varieties of Polar codes are under discussion in RAN1 (RAN (Radio Access Network) WG1 (Working Group 1)). Some varieties can increase complexity in encoding and decoding because of the inherent code construction issues and inter-dependency. For example, the encoding/decoding complexity can vary with the code size N, which is the number of stages in a Polar code.

BRIEF DESCRIPTION OF THE DRAWINGS

FIG. 10 is a diagram illustrating the number of parity bits to support a given code rate for a given number of data bits, in connection with various aspects discussed herein.

DETAILED DESCRIPTION

Figure 1:
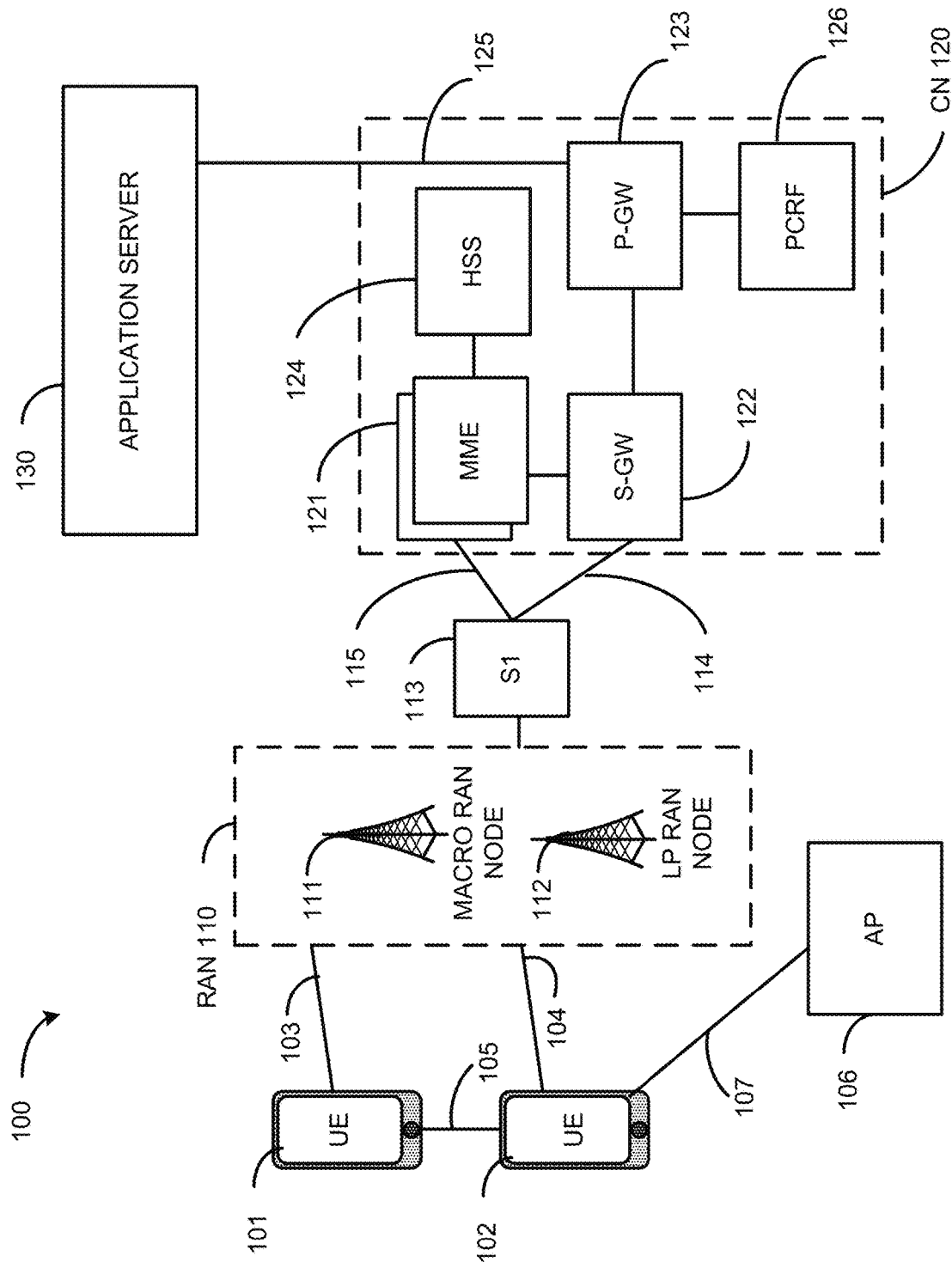
FIG. 1 is a block diagram illustrating an example user equipment (UE) useable in connection with various aspects described herein.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware. For example, a component can be a processor (e.g., a microprocessor, a controller, or other processing device), a process running on a processor, a controller, an object, an executable, a program, a storage device, a computer, a tablet PC and/or a user equipment (e.g., mobile phone, etc.) with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising." Additionally, in situations wherein one or more numbered items are discussed (e.g., a "first X", a "second X", etc.), in general the one or more numbered items may be distinct or they may be the same, although in some situations the context may indicate that they are distinct or that they are the same.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

Embodiments described herein may be implemented into a system using any suitably configured hardware and/or software. FIG. 1 illustrates an architecture of a system 100 of a network in accordance with some embodiments. The system 100 is shown to include a user equipment (UE) 101 and a UE 102. The UEs 101 and 102 are illustrated as smartphones (e.g., handheld touchscreen mobile computing devices connectable to one or more cellular networks), but may also comprise any mobile or non-mobile computing device, such as Personal Data Assistants (PDAs), pagers, laptop computers, desktop computers, wireless handsets, or any computing device including a wireless communications interface.

In some embodiments, any of the UEs 101 and 102 can comprise an Internet of Things (IoT) UE, which can comprise a network access layer designed for low-power IoT applications utilizing short-lived UE connections. An IoT UE can utilize technologies such as machine-to-machine (M2M) or machine-type communications (MTC) for exchanging data with an MTC server or device via a public land mobile network (PLMN), Proximity-Based Service (ProSe) or device-to-device (D2D) communication, sensor networks, or IoT networks. The M2M or MTC exchange of data may be a machine-initiated exchange of data. An IoT network describes interconnecting IoT UEs, which may include uniquely identifiable embedded computing devices (within the Internet infrastructure), with short-lived connections. The IoT UEs may execute background applications (e.g., keep-alive messages, status updates, etc.) to facilitate the connections of the IoT network.

The UEs 101 and 102 may be configured to connect, e.g., communicatively couple, with a radio access network (RAN) 110—the RAN 110 may be, for example, an Evolved Universal Mobile Telecommunications System (UMTS) Terrestrial Radio Access Network (E-UTRAN), a NextGen RAN (NG RAN), or some other type of RAN. The UEs 101 and 102 utilize connections 103 and 104, respectively, each of which comprises a physical communications interface or layer (discussed in further detail below); in this example, the connections 103 and 104 are illustrated as an air interface to enable communicative coupling, and can be consistent with cellular communications protocols, such as a Global System for Mobile Communications (GSM) protocol, a code-division multiple access (CDMA) network protocol, a Push-to-Talk (PTT) protocol, a PTT over Cellular (POC) protocol, a Universal Mobile Telecommunications System (UMTS) protocol, a 3GPP Long Term Evolution (LTE) protocol, a fifth generation (5G) protocol, a New Radio (NR) protocol, and the like.

In this embodiment, the UEs 101 and 102 may further directly exchange communication data via a ProSe interface 105. The ProSe interface 105 may alternatively be referred to as a sidelink interface comprising one or more logical channels, including but not limited to a Physical Sidelink Control Channel (PSCCH), a Physical Sidelink Shared Channel (PSSCH), a Physical Sidelink Discovery Channel (PSDCH), and a Physical Sidelink Broadcast Channel (PSBCH).

The UE 102 is shown to be configured to access an access point (AP) 106 via connection 107. The connection 107 can comprise a local wireless connection, such as a connection consistent with any IEEE 802.11 protocol, wherein the AP 106 would comprise a wireless fidelity (WiFi®) router. In this example, the AP 106 is shown to be connected to the Internet without connecting to the core network of the wireless system (described in further detail below).

The RAN 110 can include one or more access nodes that enable the connections 103 and 104. These access nodes (ANs) can be referred to as base stations (BSs), NodeBs, evolved NodeBs (eNBs), next Generation NodeBs (gNB), RAN nodes, and so forth, and can comprise ground stations (e.g., terrestrial access points) or satellite stations providing coverage within a geographic area (e.g., a cell). The RAN 110 may include one or more RAN nodes for providing macrocells, e.g., macro RAN node 111, and one or more RAN nodes for providing femtocells or picocells (e.g., cells having smaller coverage areas, smaller user capacity, or higher bandwidth compared to macrocells), e.g., low power (LP) RAN node 112.

Any of the RAN nodes 111 and 112 can terminate the air interface protocol and can be the first point of contact for the UEs 101 and 102. In some embodiments, any of the RAN nodes 111 and 112 can fulfill various logical functions for the RAN 110 including, but not limited to, radio network controller (RNC) functions such as radio bearer management, uplink and downlink dynamic radio resource management and data packet scheduling, and mobility management.

In accordance with some embodiments, the UEs 101 and 102 can be configured to communicate using Orthogonal Frequency-Division Multiplexing (OFDM) communication signals with each other or with any of the RAN nodes 111 and 112 over a multicarrier communication channel in accordance various communication techniques, such as, but not limited to, an Orthogonal Frequency-Division Multiple Access (OFDMA) communication technique (e.g., for downlink communications) or a Single Carrier Frequency Division Multiple Access (SC-FDMA) communication technique (e.g., for uplink and ProSe or sidelink communications), although the scope of the embodiments is not limited in this respect. The OFDM signals can comprise a plurality of orthogonal subcarriers.

In some embodiments, a downlink resource grid can be used for downlink transmissions from any of the RAN nodes 111 and 112 to the UEs 101 and 102, while uplink transmissions can utilize similar techniques. The grid can be a time-frequency grid, called a resource grid or time-frequency resource grid, which is the physical resource in the downlink in each slot. Such a time-frequency plane representation is a common practice for OFDM systems, which makes it intuitive for radio resource allocation. Each column and each row of the resource grid corresponds to one OFDM symbol and one OFDM subcarrier, respectively. The duration of the resource grid in the time domain corresponds to one slot in a radio frame. The smallest time-frequency unit in a resource grid is denoted as a resource element. Each resource grid comprises a number of resource blocks, which describe the mapping of certain physical channels to resource elements. Each resource block comprises a collection of resource elements; in the frequency domain, this may represent the smallest quantity of resources that currently can be allocated. There are several different physical downlink channels that are conveyed using such resource blocks.

The physical downlink shared channel (PDSCH) may carry user data and higher-layer signaling to the UEs 101 and 102. The physical downlink control channel (PDCCH) may carry information about the transport format and resource allocations related to the PDSCH channel, among other things. It may also inform the UEs 101 and 102 about the transport format, resource allocation, and H-ARQ (Hybrid Automatic Repeat Request) information related to the uplink shared channel. Typically, downlink scheduling (assigning control and shared channel resource blocks to the UE 102 within a cell) may be performed at any of the RAN nodes 111 and 112 based on channel quality information fed back from any of the UEs 101 and 102. The downlink resource assignment information may be sent on the PDCCH used for (e.g., assigned to) each of the UEs 101 and 102.

The PDCCH may use control channel elements (CCEs) to convey the control information. Before being mapped to resource elements, the PDCCH complex-valued symbols may first be organized into quadruplets, which may then be permuted using a sub-block interleaver for rate matching. Each PDCCH may be transmitted using one or more of these CCEs, where each CCE may correspond to nine sets of four physical resource elements known as resource element groups (REGs). Four Quadrature Phase Shift Keying (QPSK) symbols may be mapped to each REG. The PDCCH can be transmitted using one or more CCEs, depending on the size of the downlink control information (DCI) and the channel condition. There can be four or more different PDCCH formats defined in LTE with different numbers of CCEs (e.g., aggregation level, L=1, 2, 4, 8, or 16).

Some embodiments may use concepts for resource allocation for control channel information that are an extension of the above-described concepts. For example, some embodiments may utilize an enhanced physical downlink control channel (EPDCCH) that uses PDSCH resources for control information transmission. The EPDCCH may be transmitted using one or more enhanced the control channel elements (ECCEs). Similar to above, each ECCE may correspond to nine sets of four physical resource elements known as an enhanced resource element groups (EREGs). An ECCE may have other numbers of EREGs in some situations.

The RAN 110 is shown to be communicatively coupled to a core network (CN) 120—via an S1 interface 113. In embodiments, the CN 120 may be an evolved packet core (EPC) network, a NextGen Packet Core (NPC) network, or some other type of CN. In this embodiment the S1 interface 113 is split into two parts: the S1-U interface 114, which carries traffic data between the RAN nodes 111 and 112 and the serving gateway (S-GW) 122, and the S1-mobility management entity (MME) interface 115, which is a signaling interface between the RAN nodes 111 and 112 and MMEs 121.

In this embodiment, the CN 120 comprises the MMEs 121, the S-GW 122, the Packet Data Network (PDN) Gateway (P-GW) 123, and a home subscriber server (HSS) 124. The MMEs 121 may be similar in function to the control plane of legacy Serving General Packet Radio Service (GPRS) Support Nodes (SGSN). The MMEs 121 may manage mobility aspects in access such as gateway selection and tracking area list management. The HSS 124 may comprise a database for network users, including subscription-related information to support the network entities' handling of communication sessions. The CN 120 may comprise one or several HSSs 124, depending on the number of mobile subscribers, on the capacity of the equipment, on the organization of the network, etc. For example, the HSS 124 can provide support for routing/roaming, authentication, authorization, naming/addressing resolution, location dependencies, etc.

The S-GW 122 may terminate the S1 interface 113 towards the RAN 110, and routes data packets between the RAN 110 and the CN 120. In addition, the S-GW 122 may be a local mobility anchor point for inter-RAN node handovers and also may provide an anchor for inter-3GPP mobility. Other responsibilities may include lawful intercept, charging, and some policy enforcement.

The P-GW 123 may terminate an SGi interface toward a PDN. The P-GW 123 may route data packets between the EPC network 123 and external networks such as a network including the application server 130 (alternatively referred to as application function (AF)) via an Internet Protocol (IP) interface 125. Generally, the application server 130 may be an element offering applications that use IP bearer resources with the core network (e.g., UMTS Packet Services (PS) domain, LTE PS data services, etc.). In this embodiment, the P-GW 123 is shown to be communicatively coupled to an application server 130 via an IP communications interface 125. The application server 130 can also be configured to support one or more communication services (e.g., Voice-over-Internet Protocol (VoIP) sessions, PTT sessions, group communication sessions, social networking services, etc.) for the UEs 101 and 102 via the CN 120.

The P-GW 123 may further be a node for policy enforcement and charging data collection. Policy and Charging Enforcement Function (PCRF) 126 is the policy and charging control element of the CN 120. In a non-roaming scenario, there may be a single PCRF in the Home Public Land Mobile Network (HPLMN) associated with a UE's Internet Protocol Connectivity Access Network (IP-CAN)

session. In a roaming scenario with local breakout of traffic, there may be two PCRFs associated with a UE's IP-CAN session: a Home PCRF (H-PCRF) within a HPLMN and a Visited PCRF (V-PCRF) within a Visited Public Land Mobile Network (VPLMN). The PCRF 126 may be communicatively coupled to the application server 130 via the P-GW 123. The application server 130 may signal the PCRF 126 to indicate a new service flow and select the appropriate Quality of Service (QoS) and charging parameters. The PCRF 126 may provision this rule into a Policy and Charging Enforcement Function (PCEF) (not shown) with the appropriate traffic flow template (TFT) and QoS class of identifier (QCI), which commences the QoS and charging as specified by the application server 130.

Figure 2:
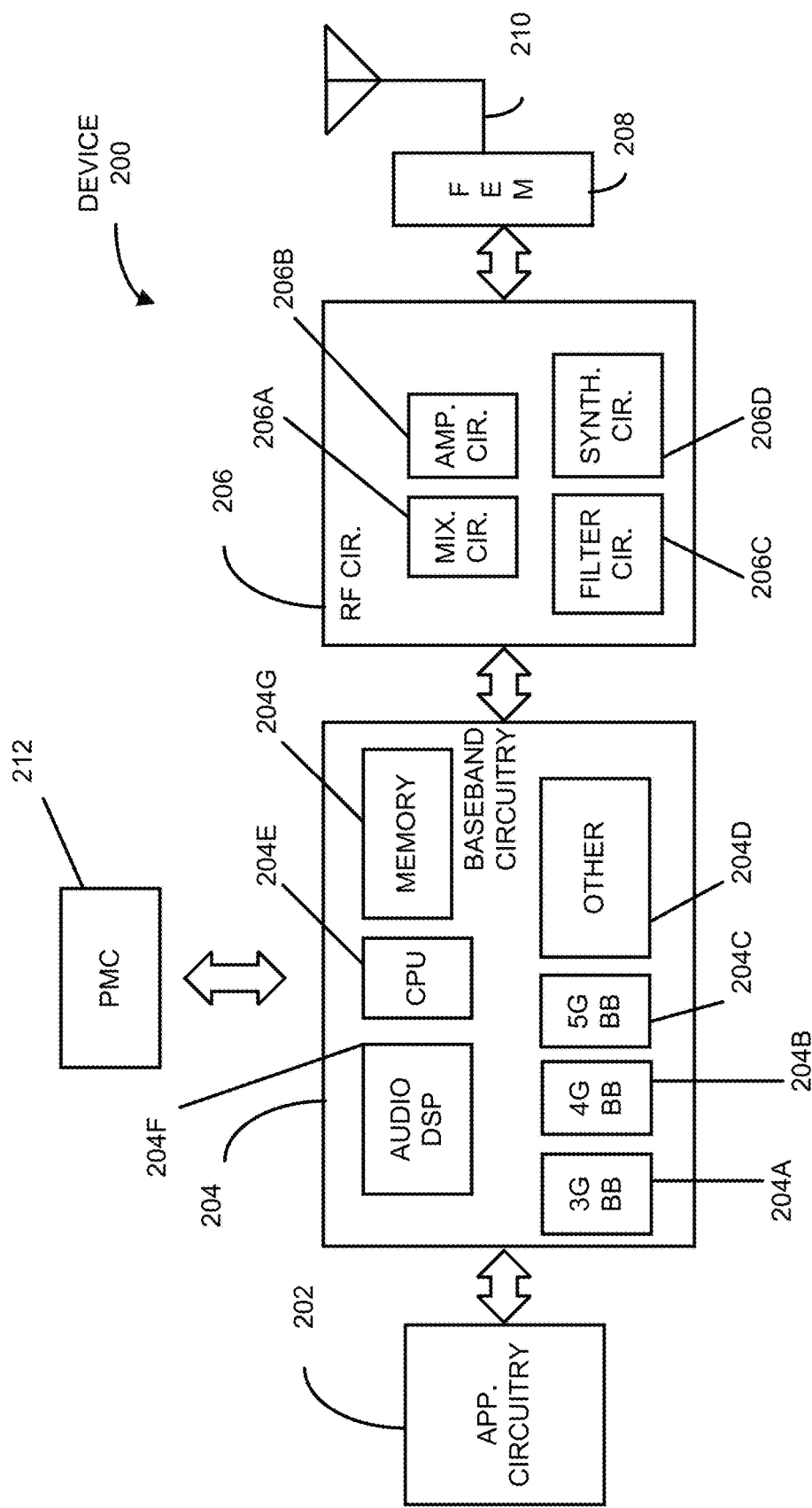
FIG. 2 is a diagram illustrating example components of a device that can be employed in accordance with various aspects discussed herein.

FIG. 2 illustrates example components of a device 200 in accordance with some embodiments. In some embodiments, the device 200 may include application circuitry 202, baseband circuitry 204, Radio Frequency (RF) circuitry 206, front-end module (FEM) circuitry 208, one or more antennas 210, and power management circuitry (PMC) 212 coupled together at least as shown. The components of the illustrated device 200 may be included in a UE or a RAN node. In some embodiments, the device 200 may include less elements (e.g., a RAN node may not utilize application circuitry 202, and instead include a processor/controller to process IP data received from an EPC). In some embodiments, the device 200 may include additional elements such as, for example, memory/storage, display, camera, sensor, or input/output (I/O) interface. In other embodiments, the components described below may be included in more than one device (e.g., said circuitries may be separately included in more than one device for Cloud-RAN (C-RAN) implementations).

The application circuitry 202 may include one or more application processors. For example, the application circuitry 202 may include circuitry such as, but not limited to, one or more single-core or multi-core processors. The processor(s) may include any combination of general-purpose processors and dedicated processors (e.g., graphics processors, application processors, etc.). The processors may be coupled with or may include memory/storage and may be configured to execute instructions stored in the memory/storage to enable various applications or operating systems to run on the device 200. In some embodiments, processors of application circuitry 202 may process IP data packets received from an EPC.

The baseband circuitry 204 may include circuitry such as, but not limited to, one or more single-core or multi-core processors. The baseband circuitry 204 may include one or more baseband processors or control logic to process baseband signals received from a receive signal path of the RF circuitry 206 and to generate baseband signals for a transmit signal path of the RF circuitry 206. Baseband processing circuitry 204 may interface with the application circuitry 202 for generation and processing of the baseband signals and for controlling operations of the RF circuitry 206. For example, in some embodiments, the baseband circuitry 204 may include a third generation (3G) baseband processor 204A, a fourth generation (4G) baseband processor 204B, a fifth generation (5G) baseband processor 204C, or other baseband processor(s) 204D for other existing generations, generations in development or to be developed in the future (e.g., second generation (2G), sixth generation (6G), etc.). The baseband circuitry 204 (e.g., one or more of baseband processors 204A-D) may handle various radio control functions that enable communication with one or more radio networks via the RF circuitry 206. In other embodiments, some or all of the functionality of baseband processors 204A-D may be included in modules stored in the memory 204G and executed via a Central Processing Unit (CPU) 204E. The radio control functions may include, but are not limited to, signal modulation/demodulation, encoding/decoding, radio frequency shifting, etc. In some embodiments, modulation/demodulation circuitry of the baseband circuitry 204 may include Fast-Fourier Transform (FFT), precoding, or constellation mapping/demapping functionality. In some embodiments, encoding/decoding circuitry of the baseband circuitry 204 may include convolution, tailbiting convolution, turbo, Viterbi, or Low Density Parity Check (LDPC) encoder/decoder functionality. Embodiments of modulation/demodulation and encoder/decoder functionality are not limited to these examples and may include other suitable functionality in other embodiments.

In some embodiments, the baseband circuitry 204 may include one or more audio digital signal processor(s) (DSP) 204F. The audio DSP(s) 204F may be include elements for compression/decompression and echo cancellation and may include other suitable processing elements in other embodiments. Components of the baseband circuitry may be suitably combined in a single chip, a single chipset, or disposed on a same circuit board in some embodiments. In some embodiments, some or all of the constituent components of the baseband circuitry 204 and the application circuitry 202 may be implemented together such as, for example, on a system on a chip (SOC).

In some embodiments, the baseband circuitry 204 may provide for communication compatible with one or more radio technologies. For example, in some embodiments, the baseband circuitry 204 may support communication with an evolved universal terrestrial radio access network (EU-TRAN) or other wireless metropolitan area networks (WMAN), a wireless local area network (WLAN), a wireless personal area network (WPAN). Embodiments in which the baseband circuitry 204 is configured to support radio communications of more than one wireless protocol may be referred to as multi-mode baseband circuitry.

RF circuitry 206 may enable communication with wireless networks using modulated electromagnetic radiation through a non-solid medium. In various embodiments, the RF circuitry 206 may include switches, filters, amplifiers, etc. to facilitate the communication with the wireless network. RF circuitry 206 may include a receive signal path which may include circuitry to down-convert RF signals received from the FEM circuitry 208 and provide baseband signals to the baseband circuitry 204. RF circuitry 206 may also include a transmit signal path which may include circuitry to up-convert baseband signals provided by the baseband circuitry 204 and provide RF output signals to the FEM circuitry 208 for transmission.

In some embodiments, the receive signal path of the RF circuitry 206 may include mixer circuitry 206*a*, amplifier circuitry 206*b* and filter circuitry 206*c*. In some embodiments, the transmit signal path of the RF circuitry 206 may include filter circuitry 206*c* and mixer circuitry 206*a*. RF circuitry 206 may also include synthesizer circuitry 206*d* for synthesizing a frequency for use by the mixer circuitry 206*a* of the receive signal path and the transmit signal path. In some embodiments, the mixer circuitry 206*a* of the receive signal path may be configured to down-convert RF signals received from the FEM circuitry 208 based on the synthesized frequency provided by synthesizer circuitry 206*d*. The amplifier circuitry 206*b* may be configured to amplify the down-converted signals and the filter circuitry 206*c* may be a low-pass filter (LPF) or band-pass filter (BPF) configured to remove unwanted signals from the down-converted signals to generate output baseband signals. Output baseband signals may be provided to the baseband circuitry 204 for further processing. In some embodiments, the output baseband signals may be zero-frequency baseband signals, although this is not a requirement. In some embodiments, mixer circuitry 206a of the receive signal path may comprise passive mixers, although the scope of the embodiments is not limited in this respect.

In some embodiments, the mixer circuitry 206a of the transmit signal path may be configured to up-convert input baseband signals based on the synthesized frequency provided by the synthesizer circuitry 206d to generate RF output signals for the FEM circuitry 208. The baseband signals may be provided by the baseband circuitry 204 and may be filtered by filter circuitry 206c.

In some embodiments, the mixer circuitry 206a of the receive signal path and the mixer circuitry 206a of the transmit signal path may include two or more mixers and may be arranged for quadrature downconversion and upconversion, respectively. In some embodiments, the mixer circuitry 206a of the receive signal path and the mixer circuitry 206a of the transmit signal path may include two or more mixers and may be arranged for image rejection (e.g., Hartley image rejection). In some embodiments, the mixer circuitry 206a of the receive signal path and the mixer circuitry 206a may be arranged for direct downconversion and direct upconversion, respectively. In some embodiments, the mixer circuitry 206a of the receive signal path and the mixer circuitry 206a of the transmit signal path may be configured for super-heterodyne operation.

In some embodiments, the output baseband signals and the input baseband signals may be analog baseband signals, although the scope of the embodiments is not limited in this respect. In some alternate embodiments, the output baseband signals and the input baseband signals may be digital baseband signals. In these alternate embodiments, the RF circuitry 206 may include analog-to-digital converter (ADC) and digital-to-analog converter (DAC) circuitry and the baseband circuitry 204 may include a digital baseband interface to communicate with the RF circuitry 206.

In some dual-mode embodiments, a separate radio IC circuitry may be provided for processing signals for each spectrum, although the scope of the embodiments is not limited in this respect.

In some embodiments, the synthesizer circuitry 206d may be a fractional-N synthesizer or a fractional N/N+1 synthesizer, although the scope of the embodiments is not limited in this respect as other types of frequency synthesizers may be suitable. For example, synthesizer circuitry 206d may be a delta-sigma synthesizer, a frequency multiplier, or a synthesizer comprising a phase-locked loop with a frequency divider.

The synthesizer circuitry 206d may be configured to synthesize an output frequency for use by the mixer circuitry 206a of the RF circuitry 206 based on a frequency input and a divider control input. In some embodiments, the synthesizer circuitry 206d may be a fractional N/N+1 synthesizer.

In some embodiments, frequency input may be provided by a voltage controlled oscillator (VCO), although that is not a requirement. Divider control input may be provided by either the baseband circuitry 204 or the applications processor 202 depending on the desired output frequency. In some embodiments, a divider control input (e.g., N) may be determined from a look-up table based on a channel indicated by the applications processor 202.

Synthesizer circuitry 206d of the RF circuitry 206 may include a divider, a delay-locked loop (DLL), a multiplexer and a phase accumulator. In some embodiments, the divider may be a dual modulus divider (DMD) and the phase accumulator may be a digital phase accumulator (DPA). In some embodiments, the DMD may be configured to divide the input signal by either N or N+1 (e.g., based on a carry out) to provide a fractional division ratio. In some example embodiments, the DLL may include a set of cascaded, tunable, delay elements, a phase detector, a charge pump and a D-type flip-flop. In these embodiments, the delay elements may be configured to break a VCO period up into Nd equal packets of phase, where Nd is the number of delay elements in the delay line. In this way, the DLL provides negative feedback to help ensure that the total delay through the delay line is one VCO cycle.

In some embodiments, synthesizer circuitry 206d may be configured to generate a carrier frequency as the output frequency, while in other embodiments, the output frequency may be a multiple of the carrier frequency (e.g., twice the carrier frequency, four times the carrier frequency) and used in conjunction with quadrature generator and divider circuitry to generate multiple signals at the carrier frequency with multiple different phases with respect to each other. In some embodiments, the output frequency may be a LO frequency (fLO). In some embodiments, the RF circuitry 206 may include an IQ/polar converter.

FEM circuitry 208 may include a receive signal path which may include circuitry configured to operate on RF signals received from one or more antennas 210, amplify the received signals and provide the amplified versions of the received signals to the RF circuitry 206 for further processing. FEM circuitry 208 may also include a transmit signal path which may include circuitry configured to amplify signals for transmission provided by the RF circuitry 206 for transmission by one or more of the one or more antennas 210. In various embodiments, the amplification through the transmit or receive signal paths may be done solely in the RF circuitry 206, solely in the FEM 208, or in both the RF circuitry 206 and the FEM 208.

In some embodiments, the FEM circuitry 208 may include a TX/RX switch to switch between transmit mode and receive mode operation. The FEM circuitry may include a receive signal path and a transmit signal path. The receive signal path of the FEM circuitry may include an LNA to amplify received RF signals and provide the amplified received RF signals as an output (e.g., to the RF circuitry 206). The transmit signal path of the FEM circuitry 208 may include a power amplifier (PA) to amplify input RF signals (e.g., provided by RF circuitry 206), and one or more filters to generate RF signals for subsequent transmission (e.g., by one or more of the one or more antennas 210).

In some embodiments, the PMC 212 may manage power provided to the baseband circuitry 204. In particular, the PMC 212 may control power-source selection, voltage scaling, battery charging, or DC-to-DC conversion. The PMC 212 may often be included when the device 200 is capable of being powered by a battery, for example, when the device is included in a UE. The PMC 212 may increase the power conversion efficiency while providing desirable implementation size and heat dissipation characteristics.

While FIG. 2 shows the PMC 212 coupled only with the baseband circuitry 204. However, in other embodiments, the PMC 212 may be additionally or alternatively coupled with, and perform similar power management operations for, other components such as, but not limited to, application circuitry 202, RF circuitry 206, or FEM 208.

In some embodiments, the PMC 212 may control, or otherwise be part of, various power saving mechanisms of the device 200. For example, if the device 200 is in an RRC_Connected state, where it is still connected to the RAN node as it expects to receive traffic shortly, then it may enter a state known as Discontinuous Reception Mode (DRX) after a period of inactivity. During this state, the device 200 may power down for brief intervals of time and thus save power.

If there is no data traffic activity for an extended period of time, then the device 200 may transition off to an RRC_Idle state, where it disconnects from the network and does not perform operations such as channel quality feedback, handover, etc. The device 200 goes into a very low power state and it performs paging where again it periodically wakes up to listen to the network and then powers down again. The device 200 may not receive data in this state, in order to receive data, it must transition back to RRC_Connected state.

An additional power saving mode may allow a device to be unavailable to the network for periods longer than a paging interval (ranging from seconds to a few hours). During this time, the device is totally unreachable to the network and may power down completely. Any data sent during this time incurs a large delay and it is assumed the delay is acceptable.

Processors of the application circuitry 202 and processors of the baseband circuitry 204 may be used to execute elements of one or more instances of a protocol stack. For example, processors of the baseband circuitry 204, alone or in combination, may be used execute Layer 3, Layer 2, or Layer 1 functionality, while processors of the application circuitry 204 may utilize data (e.g., packet data) received from these layers and further execute Layer 4 functionality (e.g., transmission communication protocol (TCP) and user datagram protocol (UDP) layers). As referred to herein, Layer 3 may comprise a radio resource control (RRC) layer, described in further detail below. As referred to herein, Layer 2 may comprise a medium access control (MAC) layer, a radio link control (RLC) layer, and a packet data convergence protocol (PDCP) layer, described in further detail below. As referred to herein, Layer 1 may comprise a physical (PHY) layer of a UE/RAN node, described in further detail below.

Figure 3:
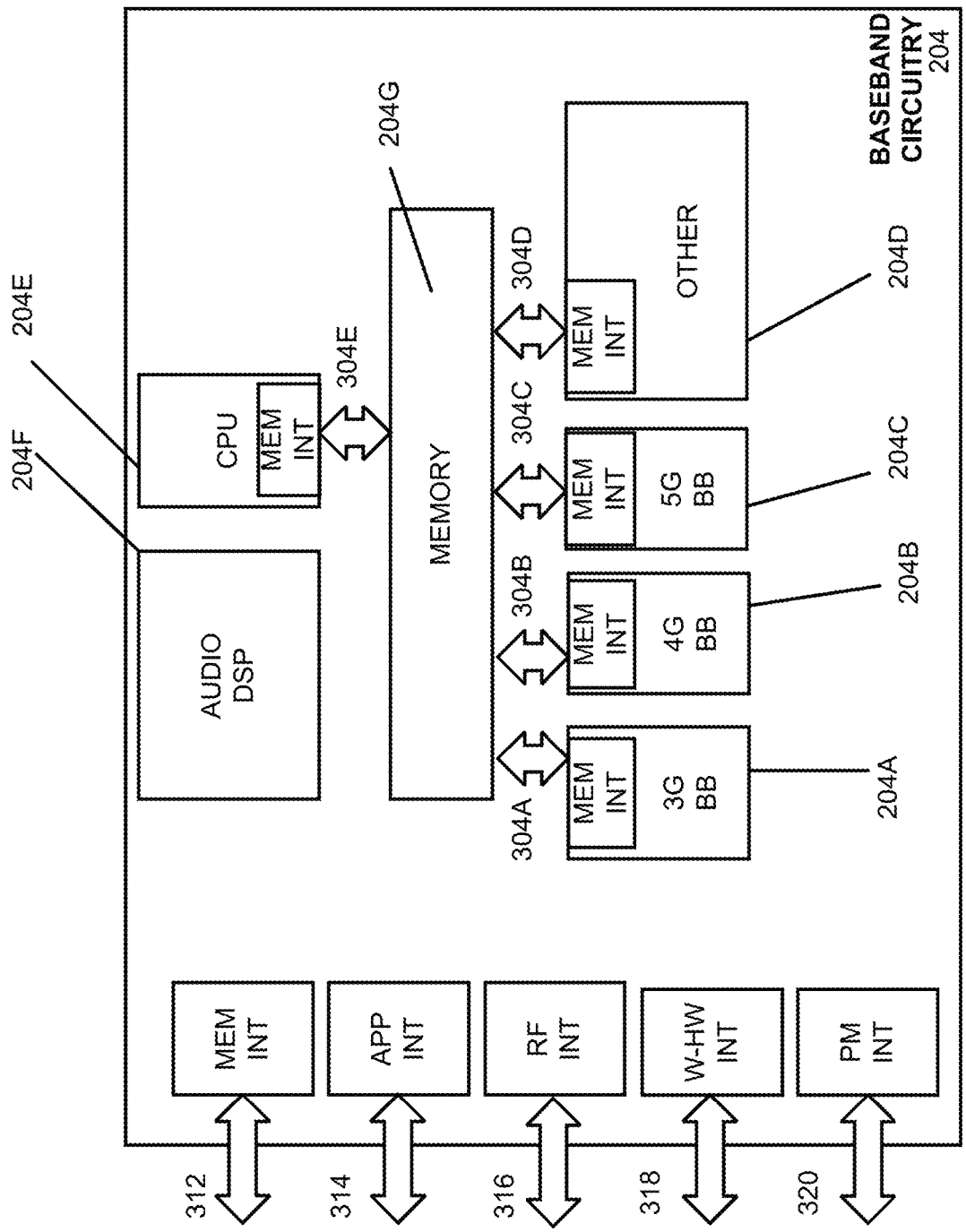
FIG. 3 is a diagram illustrating example interfaces of baseband circuitry that can be employed in accordance with various aspects discussed herein.

FIG. 3 illustrates example interfaces of baseband circuitry in accordance with some embodiments. As discussed above, the baseband circuitry 204 of FIG. 2 may comprise processors 204A-204E and a memory 204G utilized by said processors. Each of the processors 204A-204E may include a memory interface, 304A-304E, respectively, to send/receive data to/from the memory 204G.

The baseband circuitry 204 may further include one or more interfaces to communicatively couple to other circuitries/devices, such as a memory interface 312 (e.g., an interface to send/receive data to/from memory external to the baseband circuitry 204), an application circuitry interface 314 (e.g., an interface to send/receive data to/from the application circuitry 202 of FIG. 2), an RF circuitry interface 316 (e.g., an interface to send/receive data to/from RF circuitry 206 of FIG. 2), a wireless hardware connectivity interface 318 (e.g., an interface to send/receive data to/from Near Field Communication (NFC) components, Bluetooth® components (e.g., Bluetooth® Low Energy), Wi-Fi® components, and other communication components), and a power management interface 320 (e.g., an interface to send/receive power or control signals to/from the PMC 212).

Figure 4:
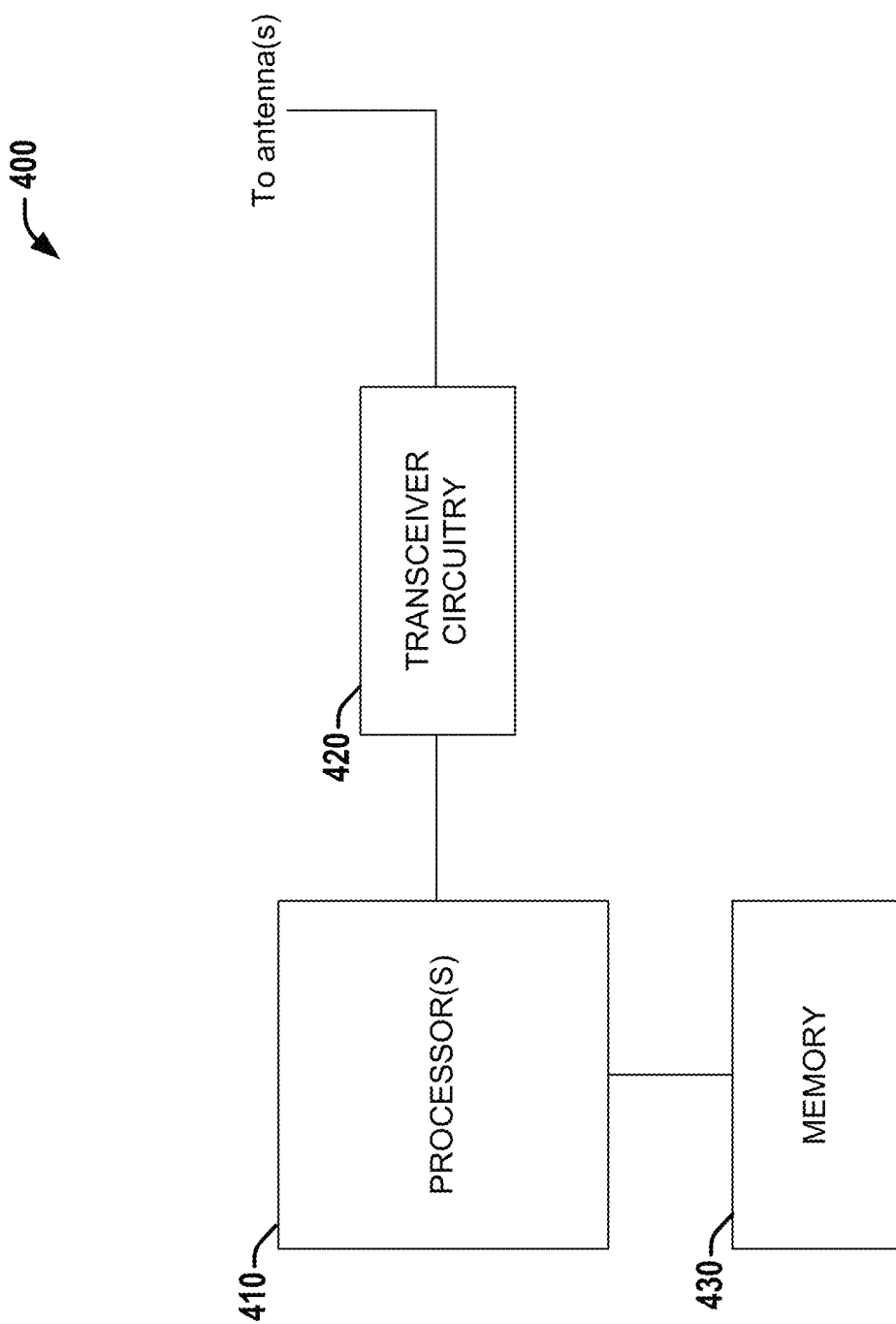
FIG. 4 is a block diagram illustrating a system employable at a UE (User Equipment) that facilitates polar coding and/or encoding in connection with a NR (New Radio) channel, according to various aspects described herein.

Referring to FIG. 4, illustrated is a block diagram of a system 400 employable at a UE (User Equipment) that facilitates polar coding and/or encoding in connection with a NR (New Radio) channel, according to various aspects described herein. System 400 can include one or more processors 410 (e.g., one or more baseband processors such as one or more of the baseband processors discussed in connection with FIG. 2 and/or FIG. 3) comprising processing circuitry and associated interface(s) (e.g., one or more interface(s) discussed in connection with FIG. 3), transceiver circuitry 420 (e.g., comprising part or all of RF circuitry 206, which can comprise transmitter circuitry (e.g., associated with one or more transmit chains) and/or receiver circuitry (e.g., associated with one or more receive chains) that can employ common circuit elements, distinct circuit elements, or a combination thereof), and a memory 430 (which can comprise any of a variety of storage mediums and can store instructions and/or data associated with one or more of processor(s) 410 or transceiver circuitry 420). In various aspects, system 400 can be included within a user equipment (UE). As described in greater detail below, system 400 can facilitate polar coding/decoding, segmentation, and associated acts at a UE.

In various aspects discussed herein, signals and/or messages can be generated and output for transmission, and/or transmitted messages can be received and processed. Depending on the type of signal or message generated, outputting for transmission (e.g., by processor(s) 410, processor(s) 510, etc.) can comprise one or more of the following: generating a set of associated bits that indicate the content of the signal or message, coding (e.g., which can include adding a cyclic redundancy check (CRC) and/or coding via one or more of turbo code, low density parity-check (LDPC) code, tailbiting convolution code (TBCC), etc.), scrambling (e.g., based on a scrambling seed), modulating (e.g., via one of binary phase shift keying (BPSK), quadrature phase shift keying (QPSK), or some form of quadrature amplitude modulation (QAM), etc.), and/or resource mapping (e.g., to a scheduled set of resources, to a set of time and frequency resources granted for uplink transmission, etc.). Depending on the type of received signal or message, processing (e.g., by processor(s) 410, processor(s) 510, etc.) can comprise one or more of: identifying physical resources associated with the signal/message, detecting the signal/message, resource element group deinterleaving, demodulation, descrambling, and/or decoding.

Figure 5:
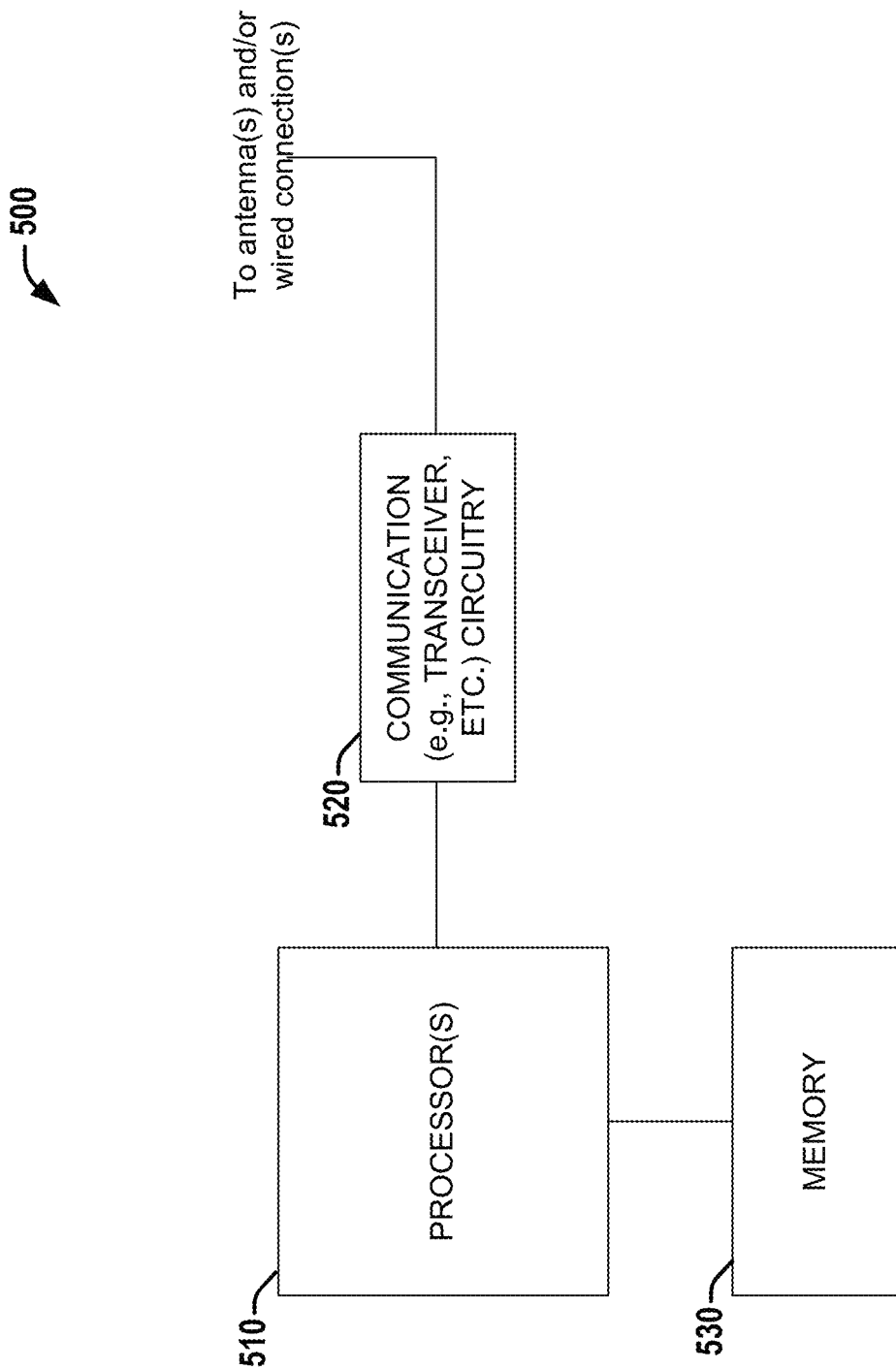
FIG. 5 is a block diagram illustrating a system employable at a BS (Base Station) that facilitates polar coding and/or encoding in connection with a NR channel, according to various aspects described herein.

Referring to FIG. 5, illustrated is a block diagram of a system 500 employable at a BS (Base Station) that facilitates polar coding and/or encoding in connection with a NR (New Radio) channel, according to various aspects described herein. System 500 can include one or more processors 510 (e.g., one or more baseband processors such as one or more of the baseband processors discussed in connection with FIG. 2 and/or FIG. 3) comprising processing circuitry and associated interface(s) (e.g., one or more interface(s) discussed in connection with FIG. 3), communication circuitry 520 (e.g., which can comprise circuitry for one or more wired (e.g., X2, etc.) connections and/or part or all of RF circuitry 206, which can comprise one or more of transmitter circuitry (e.g., associated with one or more transmit chains) or receiver circuitry (e.g., associated with one or more receive chains), wherein the transmitter circuitry and receiver circuitry can employ common circuit elements, distinct circuit elements, or a combination thereof), and memory 530 (which can comprise any of a variety of storage mediums and can store instructions and/or data associated with one or more of processor(s) 510 or communication circuitry 520). In various aspects, system 500 can be included within an Evolved Universal Terrestrial Radio Access Network (E-UTRAN) Node B (Evolved Node B, eNodeB, or eNB), next generation Node B (gNodeB or gNB) or other base station or TRP (Transmit/Receive Point) in a wireless communications network. In some aspects, the processor(s) 510, communication circuitry 520, and the memory 530 can be included in a single device, while in other aspects, they can be included in different devices, such as part of a distributed architecture. As described in greater detail below, system 500 can facilitate polar coding/decoding, segmentation, and associated acts at a gNB.

Polar codes are error-correction codes that can achieve the capacity of some memoryless communication channels. For a polar code, the encoder can take as input a length-N binary vector $U_1^N$ and computes $X_1^N = U_1^N G_N$, where $G_n$ is the n-th Kronecker power of the 2×2 matrix $$G_1 = \begin{bmatrix} 1 & 0 \\ 1 & 1 \end{bmatrix} \cdot X_1^N$$

(e.g., as generated by processor(s) 410 or processor(s) 510) can then be transmitted (e.g., by transceiver circuitry 420 or communication circuitry 520) through the communication channel. Various coding rates can be achieved (e.g., by processor(s) 410 or processor(s) 510) by setting the desired number of encoder inputs $U_i$ to data bits, and freezing the remaining bit values to predetermined values (e.g., all zeros). For example, to encode a rate 1/2 code, half of the $U_i$'s can be set to data bits, and the rest frozen to their predetermined values. The choice of which bit indices to freeze (and to what values) and which bits to use for data is fixed before transmission and communicated between the transmitter and the receiver. In various aspects, for a NR (New Radio) system, polar codes can be used for DL (Downlink) and/or UL (Uplink) control channels.

Additionally, in a NR system, a maximal codeword length $N_{max}$ can be defined for polar codes. In various aspects, to support an arbitrary transport block size (K), code block segmentation can be employed (e.g., by processor(s) 410 and/or processor(s) 510). Code block segmentation can involve a division (e.g., by processor(s) 410 and/or processor(s) 510) of a transport block into several segments (e.g., 2 or more) which can be encoded and decoded (e.g., by processor(s) 410 and transceiver circuitry 420, and/or processor(s) 510 and communication circuitry 520) independently. In various aspects, techniques discussed herein can be employed to determine whether to use code block segmentation or not for a particular transport block size and code rate.

In conventional LTE (Long Term Evolution) systems, segmentation is only applied when the transport block size is larger than a maximal supported code block length (e.g., K>Z, where Z is a constant). However, employing such a rule in connection with NR polar codes can lead to non-optimal error correction performance.

NR Polar Code Support of Large Payloads

In a first set of aspects discussed herein, techniques discussed herein can be employed (e.g., by system 400 and/or system 500) in conjunction with polar code to reduce overall complexity of coding and/or decoding (e.g., by processor(s) 410 and/or processor(s) 510). In various aspects, these techniques can comprise one or more of: (1) segmentation of large input blocks; (2) internal bits transmission; (3) code size and association with control channel element size; or (4) list decoding capability indication.

Figure 6:
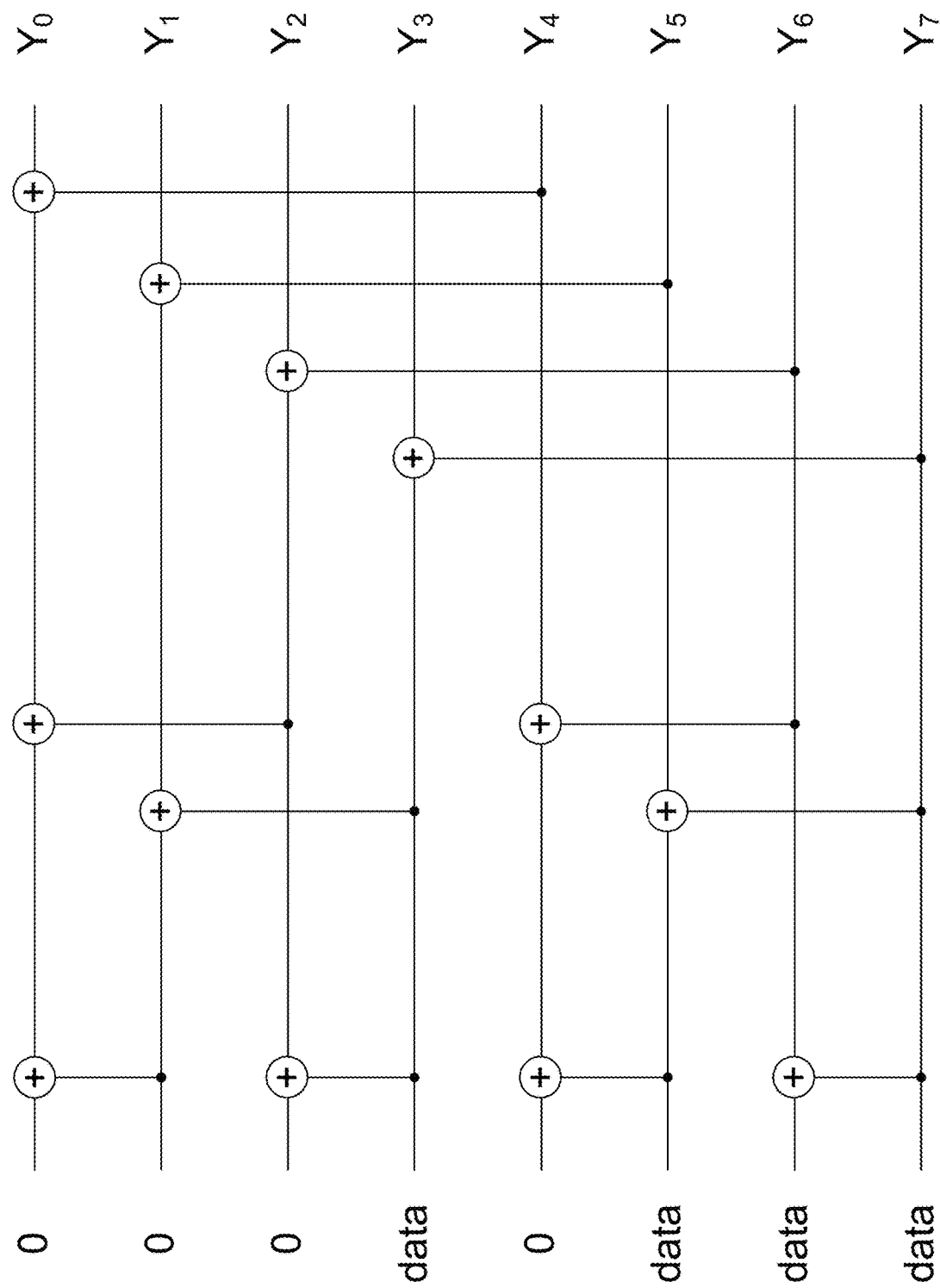
FIG. 6 is a diagram illustrating an example polar code of code size N=8, in connection with various aspects described herein

Polar codes can support very flexible information and code block sizes. Referring to FIG. 6, illustrated is a diagram showing an example polar code of code size N=8, in connection with various aspects described herein.

Figure 7:
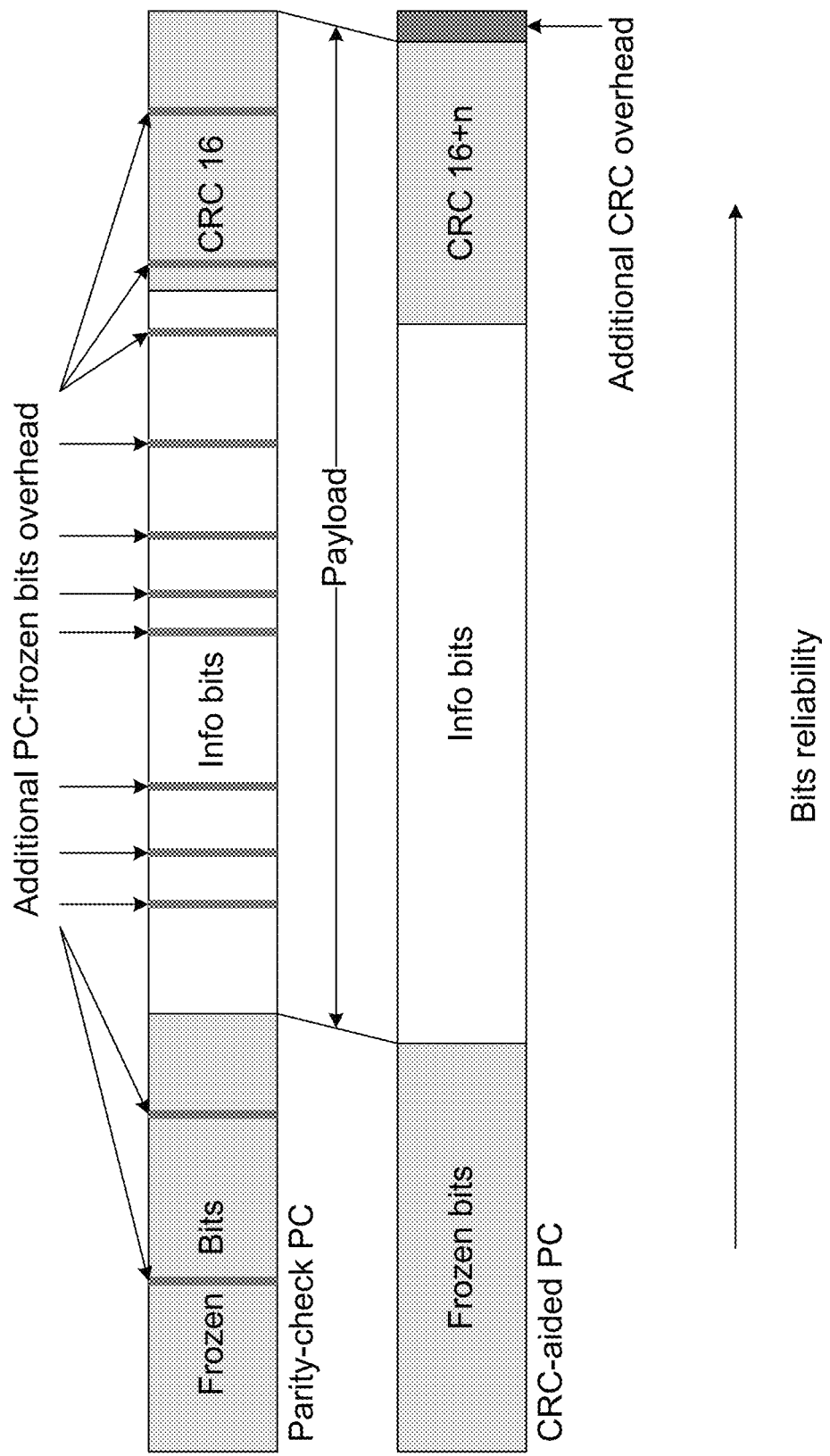
FIG. 7 is a diagram illustrating two examples of polar code, according to various aspects discussed herein.

Polar encoding can employ (e.g., at processor(s) 410 and/or processor(s) 510) a recursive structure for a code size $N=2^n$, and a sequence can determine the locations in which data can be placed in the input positions and the remaining input positions (e.g., on the left side of FIG. 6) can be frozen (e.g., fixed to a known value (e.g., 0), which can be known at both the encoder (e.g., one of processor(s) 410 or processor(s) 510) and decoder (e.g., the other of processor(s) 410 or processor(s) 510). A reliability sequence (e.g., shared between the encoder and decoder) can identify the locations of the data bits and frozen bits. Referring to FIG. 7, illustrated is a diagram showing two examples of polar code, according to various aspects discussed herein. IN the upper example of FIG. 7, an additional set of parity-check bits can be embedded (e.g., by processor(s) 410 and/or processor(s) 510) on top of the information and/or frozen bits during the polar encoding (e.g., by processor(s) 410 or processor(s) 510). In various aspects, a Cyclic Redundancy Check (CRC) (e.g., of length 16 in the upper example of FIG. 7, or of 16+n in the lower example of FIG. 7) can be attached (e.g., by one of processor(s) 410 or processor(s) 510) to support CRC-aided list decoding of the Polar code or to detect errors (e.g., by the other of processor(s) 410 or processor(s) 510) in transmission (e.g., via one of transceiver circuitry 420 or communication circuitry 520) of data.

Polar code complexity (especially at the decoder) depends upon the code size (N) and the list size (L). Typically, list size (L) is an implementation choice and can be specific to a receiver (e.g., at transceiver circuitry 420 or communication circuitry 520). On the other hand, code size N is a parameter property of the polar code itself, and is integral to the code description at a transmitter and receiver (e.g., transceiver circuitry 420 and communication circuitry 520, or vice versa). The maximum code size N supported by a polar code can drive the latency and complexity of a decoder designed to handle such code, thus limiting N can be advantageous.

Polar codes can be suitable for small block sizes, such as control information in NR or 5G (Fifth Generation) cellular systems. While control information payload is typically small, there are scenarios wherein the control information payload can be large (e.g., finer channel quality information, Rank Information, Beam indication information, HARQ feedback bits, etc.). For such scenarios, it can be advantageous to simultaneously minimize the value of N, while still supporting relatively larger information payloads. In various embodiments employing the first and/or second set of aspects discussed herein, resource segmentation can be employed in connection with polar codes for NR, which can provide multiple advantages, such as facilitating simultaneously minimization of the value of N, while still supporting relatively larger information payloads.

Information Payload and Resource Segmentation

According to a first option for segmentation in the first set of aspects, if the information payload size exceed a threshold (e.g., Kr) (e.g., as determined by the encoding processor(s), such as processor(s) 410 for UL or processor(s) 510 for DL), the payload can be segmented (e.g., by processor(s) 410 or processor(s) 510) into multiple segments, each of which can be encoded individually (e.g., by processor(s) 410 or processor(s) 510) using a Polar encoder associated with a first code size N (which can be a maximum code size), and the encoded segments can be concatenated (e.g., by processor(s) 410 or processor(s) 510) prior to transmission (e.g., by transceiver circuitry 420 or communication circuitry 520). In various aspects, the segment size(s) can be selected (e.g., by processor(s) 410 or processor(s) 510) from a set of allowed segment sizes (e.g., which can be predefined or configured via higher layer signaling generated by processor(s) 510, transmitted by communication circuitry 520, received by transceiver circuitry 420, and processed by processor(s) 410). Each segment can be encoded (e.g., by processor(s) 410 or processor(s) 510) with an outer code (e.g., CRC or a parity-check bit) prior to Polar coding.

In various aspects, the maximum code size N and/or the threshold (Kr) can be configured by the BS (e.g., gNB) via higher layer signaling (e.g., generated by processor(s) 510, transmitted by communication circuitry 520, received by transceiver circuitry 420, and processed by processor(s) 410).

In other aspects, the maximum code size M and/or the threshold $K_T$ can be predefined. In one such example, the threshold $K_T$ can be 256 and N can be 1024. In another such example, the threshold $K_T$ can be 128 and N can be 512.

Figure 8:
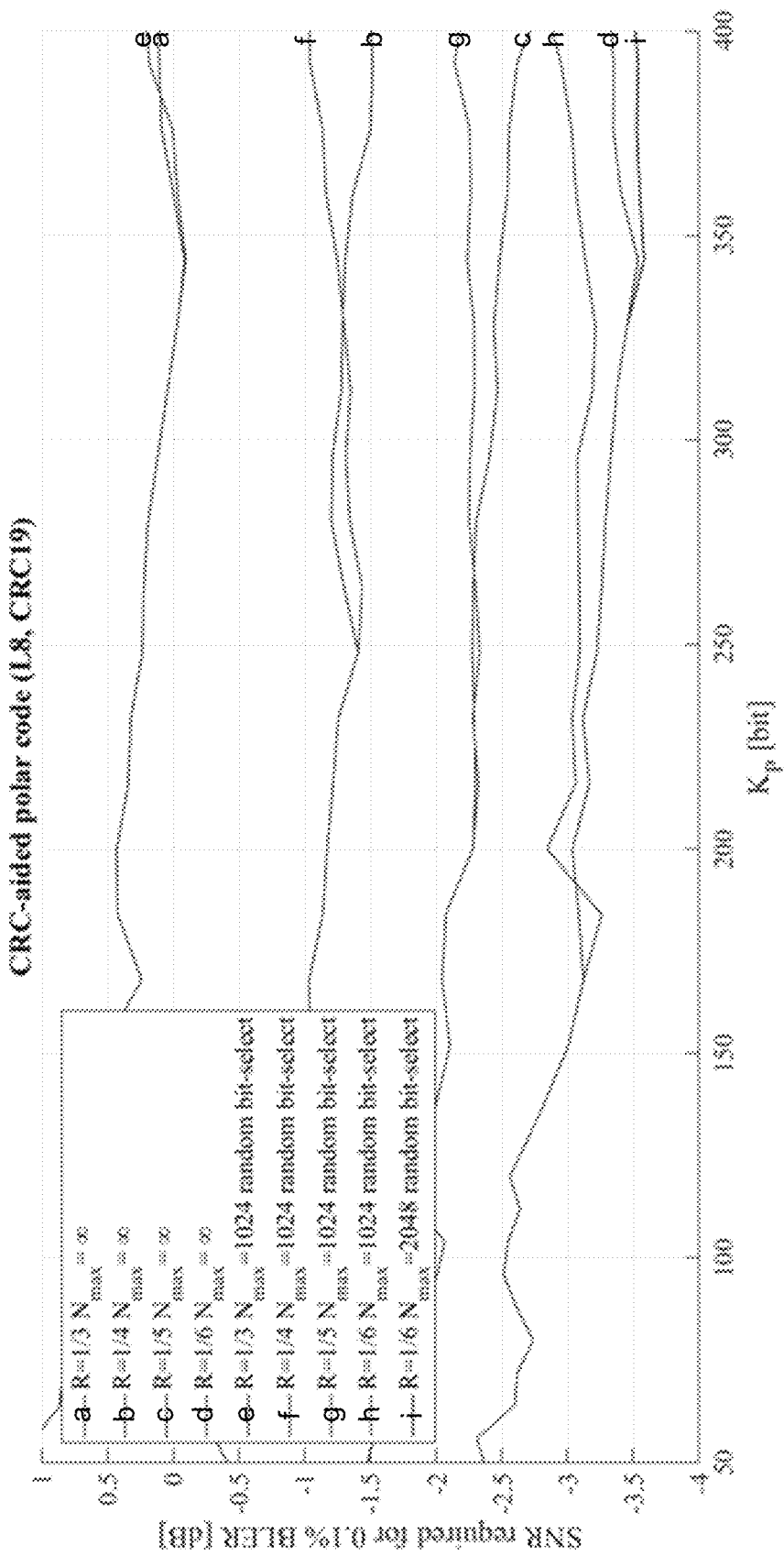
FIG. 8 is a diagram illustrating performance of examples of CRC (Cyclic Redundancy Check)-aided polar codes for various coding rates and code sizes, according to various aspects discussed herein.

Referring to FIG. 8, illustrated is a diagram showing performance of examples of CRC (Cyclic Redundancy Check)-aided polar codes for various coding rates and code sizes, according to various aspects discussed herein. As can be seen in FIG. 8, the performance between K=350 and K=175 is roughly similar, indicating that the 'loss' of coding gain is negligible. In the example of FIG. 8, a length 19 CRC is attached, and the X-axis shows the length including CRC bits.

According to a second option for segmentation in the first set of aspects, if a threshold based on information payload size and a second value (minimum code rate) exceed a threshold ($N_T$), the payload can be segmented (e.g., by processor(s) 410 or processor(s) 510) into multiple segments, each of which can be encoded individually (e.g., by processor(s) 410 or processor(s) 510) using a polar encoder associated with a first code size $N_T$, and the encoded segments can be concatenated (e.g., by processor(s) 410 or processor(s) 510) prior to transmission (e.g., by transceiver circuitry 420 or communication circuitry 520).

In one example, the second value can be a minimum rate of Rmin=1/4, and the threshold $N_T$ can be 1024, and if an information payload size K satisfies the relation K/Rmin>$N_T$ (e.g., as determined by processor(s) 410 or processor(s) 510), the information payload can be segmented (e.g., by processor(s) 410 or processor(s) 510) into multiple segments, wherein each segment can be of substantially equal size (e.g., equal, as equal as possible, or with the smallest segment having a size within i bits of the size of the largest segment, etc.). For example, if K=305, and Rmin=1/4, and $N_T$=1024, then the information payload can be segmented (e.g., by processor(s) 410 or processor(s) 510) into two pieces, a first of size 153 and a second of size 152, and the second segment can be zero-padded (e.g., by processor(s) 410 or processor(s) 510) with a filler bit to make the segment size equal prior to Polar encoding.

Additionally, in various aspects, a hybrid of options 1 and 2 can also be supported.

While the above options are discussed only in connection with the segmentation of an information payload, in various aspects, the same segmentation techniques can also be applied to the resources utilized for transmission of the encoded information payload. For example, if the number of resource elements for transmission of an information payload is $N_{RE}$, then if the information payload is segmented (e.g., by processor(s) 410 or processor(s) 510) into C segments, then the resource elements for transmission (e.g., by transceiver circuitry 410 or communication circuitry 520) of each segment can be determined (e.g., by processor(s) 410 or processor(s) 510) by $\lceil N_{RE}/C \rceil$ (ceil($N_{RE}/C$)) or $\lfloor N_{RE}/C \rfloor$ (floor($N_{RE}/C$)).

Internal Bit Transmission to Support Lowered Code Rates

Figure 9:
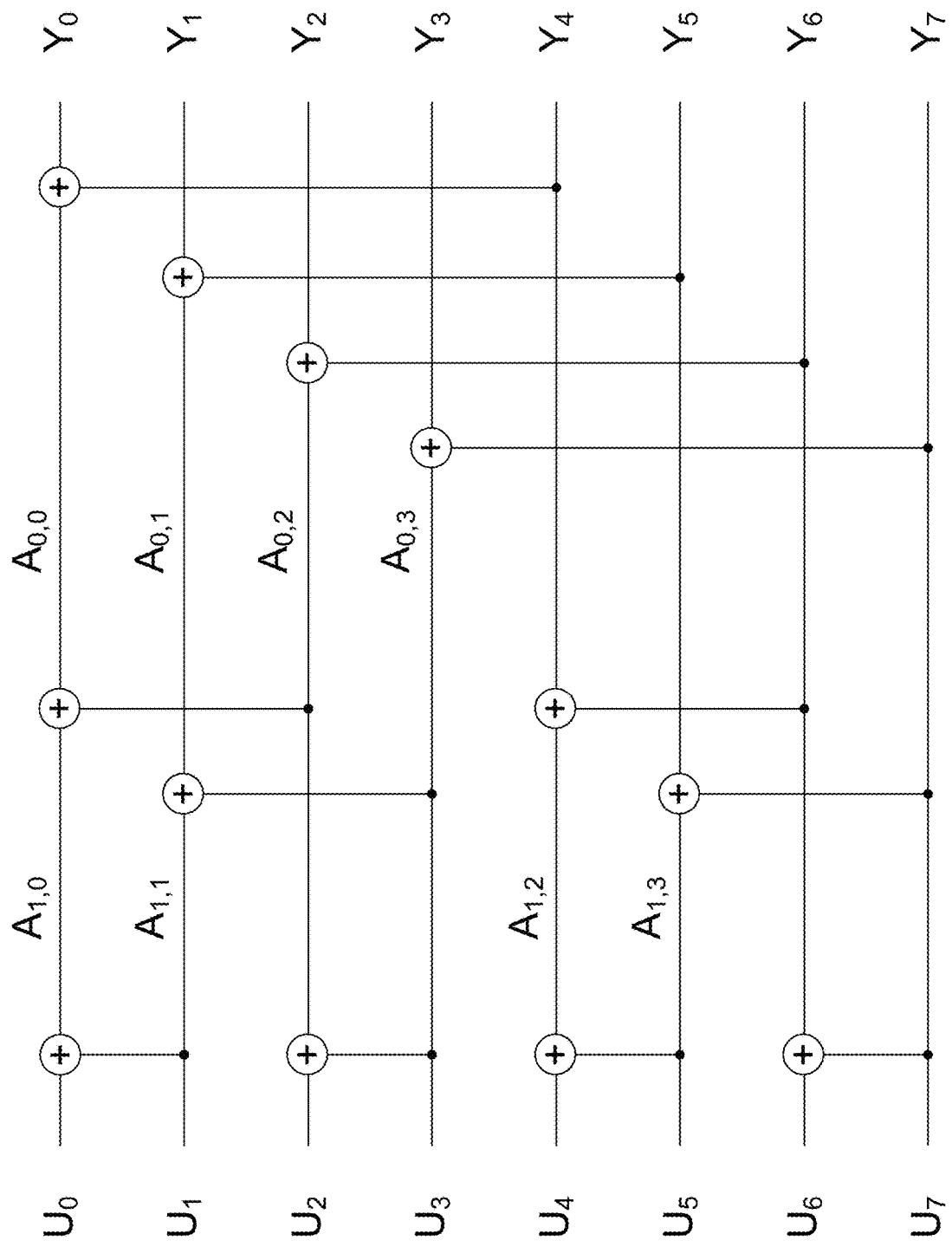
FIG. 9 is a diagram illustrating an example polar encoder with $N_T=8$ along with various internal bits, according to various aspects discussed herein.

In various embodiments of the first set of aspects, if a value based on information payload size and a desired code rate R exceeds a threshold ($N_T$), then the codeword (e.g., generated by processor(s) 410 or processor(s) 510) for transmission (e.g., via transceiver circuitry 420 or communication circuitry 520) can comprise the polar codeword and at least one internal bit of the polar encoder. Referring to FIG. 9, illustrated is a diagram showing an example polar encoder with $N_T$=8 along with various internal bits, according to various aspects discussed herein. In FIG. 9, $U_0$-$U_7$ are the input data bits and frozen bits, $Y_0$-$Y_7$ is the polar codeword, and $A_{i,j}$ are the internal bits of the polar encoder.

Each internal stage of a polar encoder (e.g., at system 400 or system 500) of code size N can offer up to N/2 unique internal bits. In some embodiments employing the first set of aspects, the number of stages from which internal bits (e.g., generated by processor(s) 410 or processor(s) 510) can be transmitted (e.g., via transceiver circuitry 420 or communication circuitry 520) can be configured by BS (e.g., gNB) via higher layer signaling (e.g., generated by processor(s) 510, transmitted via communication circuitry 520, received via transceiver circuitry 420, and processed by processor(s) 410). In other embodiments employing the first set of aspects, the number of stages from which internal bits (e.g., generated by processor(s) 410 or processor(s) 510) can be transmitted (e.g., via transceiver circuitry 420 or communication circuitry 520) can be predefined (e.g., can be 1, 2, 3, 4, 5, 6, 7, 8, or 9).

In another embodiment, the number of stages from which internal bits (e.g., generated by processor(s) 410 or processor(s) 510) can be transmitted (e.g., via transceiver circuitry 420 or communication circuitry 520) can be selected (e.g., by processor(s) 510) based on an indication from the receiver (e.g., employing system 500) via capability signaling (e.g., generated by processor(s) 410, transmitted via transceiver circuitry 420, received via communication circuitry 520, and processed by processor(s) 510).

Signaling for List Decoding

Polar code performance can be improved with list decoding bits (e.g., by processor(s) 410 or processor(s) 510), and a CRC (or parity-check code) can assist the list decoder in improving performance. However, the overall performance is closely linked to CRC length and list size. Thus, with improved capability a receiver (e.g., comprising system 400 or system 500) can benefit from the CRC length being adapted via one or more mechanisms discussed herein.

In various embodiments employing the first set of aspects, a BS (e.g., gNB) can dynamically indicate or semi-statically configure (e.g., via signaling generated by processor(s) 510, transmitted via communication circuitry 520, received via transceiver circuitry 420, and processed by processor(s) 410) the length of CRC to be attached to a payload (e.g., on the uplink) by a UE (e.g., by processor(s) 410), prior to polar encoding (e.g., by processor(s) 410). The length of CRC may be indicated via downlink control or downlink physical broadcast control channel (e.g., generated by processor(s) 510, transmitted via communication circuitry 520, received via transceiver circuitry 420, and processed by processor(s) 410).

In other embodiments employing the first set of aspects, a UE can indicate (e.g., generated by processor(s) 410, transmitted via transceiver circuitry 420, received via communication circuitry 520, and processed by processor(s) 510) its decoding capability (e.g., list decoding capability) via an uplink signal (e.g., during an initial access procedure), and the BS (e.g., gNB) can explicitly configure (e.g., via signaling generated by processor(s) 510, transmitted via communication circuitry 520, received via transceiver circuitry 420, and processed by processor(s) 410) the CRC length to be attached (e.g., by processor(s) 410) to an information payload (e.g., to be transmitted on the downlink) to the UE, prior to polar encoding (e.g., by processor(s) 410). The BS (e.g., gNB) can explicitly indicate (e.g., via signaling generated by processor(s) 510, transmitted via communication circuitry 520, received via transceiver circuitry 420, and processed by processor(s) 410) the CRC length to the UE prior to applying (e.g., by processor(s) 510) the CRC length.

In further embodiments employing the first set of aspects, a BS (e.g., gNB) apply (e.g., via processor(s) 510) a first CRC length to an information payload (e.g., generated by processor(s) 510) transmitted (e.g., via communication circuitry 520) based on a first control resource set (e.g., generated by processor(s) 510, transmitted via communication circuitry 520, received via transceiver circuitry 420, and processed by processor(s) 410), and the BS (e.g., gNB) can apply (e.g., via processor(s) 510) a second CRC length to an information payload (e.g., generated by processor(s) 510) transmitted (e.g., via communication circuitry 520) based on a second control resource set (e.g., generated by processor(s) 510, transmitted via communication circuitry 520, received via transceiver circuitry 420, and processed by processor(s) 410). The first control resource set can correspond to a first set of control channels decoded via a first list size at the UE (e.g., by processor(s) 410), and a second control resource set may correspond to a second set of control channels decoded via a second list size at the UE (e.g., by processor(s) 410).

In other embodiments employing the first set of aspects, a BS (e.g., gNB) can dynamically indicate or semi-statically configure (e.g., via DCI (Downlink Control Information) or higher layer signaling generated by processor(s) 510, transmitted via communication circuitry 520, received via transceiver circuitry 420, and processed by processor(s) 410) a parameter to control the outer code to be attached to an information payload (e.g., on the uplink) by a UE (e.g., by processor(s) 410), prior to polar encoding (e.g., by processor(s) 410).

In still other embodiments employing the first set of aspects, a UE can indicate its decoding capability (e.g., list decoding capability) via an uplink signal (e.g., generated by processor(s) 410, transmitted via transceiver circuitry 420, received via communication circuitry 520, and processed by processor(s) 510), such as during an initial access procedure, and a BS (e.g., gNB) can explicitly configure (e.g., via signaling generated by processor(s) 510, transmitted via communication circuitry 520, received via transceiver circuitry 420, and processed by processor(s) 410) a parameter to control the outer code to be attached (e.g., by processor(s) 410) to an information payload (e.g., to be transmitted on the downlink) to the UE, prior to polar encoding (e.g., by processor(s) 410). The BS (e.g., gNB) can explicitly indicate the parameter to the UE (e.g., via signaling generated by processor(s) 510, transmitted via communication circuitry 520, received via transceiver circuitry 420, and processed by processor(s) 410) prior to applying (e.g., via processor(s) 510) the parameter.

Code Size and Association with Control Channel Element Size

For downlink control (e.g., NR PDCCH (Physical Downlink Control Channel) generated by processor(s) 510, transmitted via communication circuitry 520, received via transceiver circuitry 420, and processed by processor(s) 410), the supported information block sizes can occur in a range of values, and the supported coded block sizes can occur in a range of values. As one example, the supported information block sizes can be in the range 24-128 bits, while the supported coded block sizes may be dependent upon the control resource configuration. For example, the possible coded block sizes can correspond to 72, 144, 288 (which can be achieved (e.g., by processor(s) 410 or processor(s) 510) via a code size of N=512 with puncturing or N=256 with repetition), and 576 (which can be achieved (e.g., by processor(s) 410 or processor(s) 510) via a code size of N=512 with repetition to get 576 coded bits), which can correspond to a control channel element (CCE) size of 36 resource elements (REs), and each resource element corresponding to 2 bits (e.g., for QPSK (Quadrature Phase Shift Keying) modulation), and with aggregation of 1, 2, 4 and 8 CCEs. Since polar code natively supports only powers of 2 for code size (e.g., N=512/256/128/64, etc.), the polar codeword can be matched to the expected coded block size (e.g., via puncturing, repetition, transmission of internal bits, etc.). For example, for a coded size of 288 (e.g., aggregation level 4), the code can be obtained from N=512 using puncturing, or from N=256 using repetition or internal bits transmission.

In various embodiments employing the first set of aspects, one or more of the following example code sizes can be employed: the code size used (e.g., by processor(s) 410 or processor(s) 510) for a first CCE size of 72 can be N=64, the code size used (e.g., by processor(s) 410 or processor(s) 510) for a second CCE size of 144 can be N=128, the code size used (e.g., by processor(s) 410 or processor(s) 510) for a third CCE size of 288 can be N=256, and/or the code size used (e.g., by processor(s) 410 or processor(s) 510) for a first CCE size of 576 can be N=512.

In further embodiments employing the first set of aspects, the code size used (e.g., by processor(s) 410 or processor(s) 510) for a CCE size can be N, with at least partial repetition of the polar codeword or transmission (e.g., via transceiver circuitry 420 or communication circuitry 520) of internal bits from one stage of the first polar encoder of size N (e.g., generated by processor(s) 410 or processor(s) 510). The following example embodiments can be employed in connection with the first set of aspects: (a) N=64 and the CCE size can be in the range of 32-40 REs; (b) N=128 and the CCE size can be in the range of 64-80 REs; (c) N=256 and the CCE size can be in the range of 128-160 REs; and (d) N=512 and the CCE size can be in the range of 256-320 REs.

Types of Polar Code and Associated Details

In standard polar codes, the input locations are typically marked as data locations or frozen locations, which can simplify implementation for both encoding and decoding operations (e.g., by processor(s) 410 or processor(s) 510). In such aspects, a single reliability bit sequence can be used (e.g., by processor(s) 410 or processor(s) 510) to identify which bits correspond to data and which bits correspond to frozen bits. Typically, the data bits can also contain a CRC that can be used to assist list decoding in selecting a suitable candidate as estimated data bits at the end of decoding. Typically, this CRC check can be considered as a parallel operation that can be performed separately form the core list polar decoding algorithm (e.g., implemented by processor(s) 410 or processor(s) 510).

In contrast, in some techniques, such as parity-check polar, there is an additional input location type (e.g., such as parity-check bits for parity-check polar) in addition to data bits and frozen locations. These additional bits (e.g., parity-check bits) are interspersed and can also form additional linkage between the set of data bits and the additional (e.g., parity-check) bits. This can lead to additional complexity as the number of parity-check bits and their actual location within the input varies as a function of the data block size and code rate. Referring to FIG. 10, illustrated is a chart showing the number of parity bits to support a given code rate for a given number of data bits, in connection with various aspects discussed herein. The leftmost column shows the number of data bits ($K_P$), and the remaining columns show the number of parity-check bits to support a particular code rate (with the corresponding code rates indicated in the top row). For example, for $K_P$=40, rate 1/5, and a polar code having a length N=256 (i.e. nearest power of 2 that is larger than $K_P$/rate), there are $K_P$=40 data bit locations, locations corresponding to parity-check bits, and the remaining (256−40−31)=185 bits are frozen bits.

The number of PC-bits in a PC-polar code can be determined based on equation (1):

$$F_p = \log_2 N \times (\alpha - |\alpha \times (K/M - 1/2)|^2) \quad (1),$$

where K is the number of information bits, a is a predefined constant (e.g., 1.5), M is the number of bits that are transmitted, and N is the mother code size of the polar code used for encoding K information bits to generate M bits for transmission.

$F_p$ in equation (1) is a threshold that can be used in determination of the number of parity-check bits, but the actual number of parity-check bits can be determined in two stages: (1) A small number of relatively more reliable bit positions can be marked for parity-check (or PC-frozen), and (2) an additional larger number of relatively less reliable bit positions can be marked for parity-check (or PC-frozen).

To support a block size between 40 and 100 bits and coded sequence of length M that is one of {576, 288, 144, 72} (e.g., obtained by polar coding and rate-matching) involves a number of combinations of rates and lengths of around 60×4=240 combinations. Each of these combinations has associated locations to be stored for parity-check bits, data bits, and frozen bits. The arrangement of these bits (data/frozen/parity-check) can impact decoding implementations such as scheduling and latency. For example, it could be that the latency for K=59 and 576 coded bits can be different than K=60 and 576 coded bits, even though they are very close to each other in block lengths, and the locations of PC-bits/frozen/data bits might be different in these two scenarios. This can be true, for example, if the decoder employs (e.g., via processor(s) 410 or processor(s) 510) a simplified successive cancellation list decoder or a multi-bit decoder.

For each triplet of K, N and M, the number of PC-bits can be different and the location of the PC-bits can also be different, which leads to increased complexity on the encoder/decoder. As an additional example, with K between 28 and 128, and M one of 576, 288, 144, or 72, there are around 4×100=400 combinations to be supported, and for each combination, information to be stored to identify the number of PC-bits and the location of the PC-bits on the polar code input. Additionally, a decoder would need to be designed for many scenarios, which could complicate the overall design.

In various aspects, to minimize complexity, a subset of potential combinations could be employed (e.g., predefined allowed values for polar code block sizes). For example, supported block sizes for polar code could be multiples of number(s) (e.g., 4, 8, etc.) within predetermined range(s), and segment sizes could be confined to only the supported block sizes for Polar code. The following are examples of potential block sizes, although in various embodiments, other block sizes can be employed: (1) $K_{supported}$ can be block sizes that are multiples of 4 and lie within a range $K_{min}$ to $K_{max}$ (e.g., 24 to 128); (2) $K_{supported}$ can be block sizes that are multiples of 8 and lie within a range $K_{min}$ to $K_{max}$ (e.g., 24 to 128); or (3) $K_{supported}$ can be block sizes that are multiples of 4 and lie within a first range $K_{min1}$ to $K_{max1}$ (e.g., 24 to 128) or block sizes that are multiples of 8 and lie within a second range $K_{min2}$ to $K_{max2}$ (e.g., 128 to 256). In various embodiments, potential block sizes can be readily extended to include multiple ranges (e.g., 2 or more, etc.).

Polar Code Block Segmentation and Interleaving

In embodiments employing a second set of aspects, a threshold-based rule can be employed (e.g., by processor(s) 410 or processor(s) 510) to determine the application area of polar code block segmentation. Employing such threshold-based rules can provide improved performance for NR polar codes for large payloads, without significant increase in complexity. In various such aspects, code block segmentation can be applied (e.g., by processor(s) 410 or processor(s) 510) for $K > K_{seg}$ and $R < R_{seg}$. Additionally, in aspects, these thresholds ($K_{seg}$ and $R_{seg}$) can be constant or can be derived (e.g., by processor(s) 410 or processor(s) 510) via linear formula (e) from a current payload K or code rate R, such as in equations (2) and (3):

$$R_{seg}(K) = a_1 K + b_1 \quad (2)$$

$$K_{seg}(R) = a_2 R + b_2 \quad (3),$$

Figure 11:
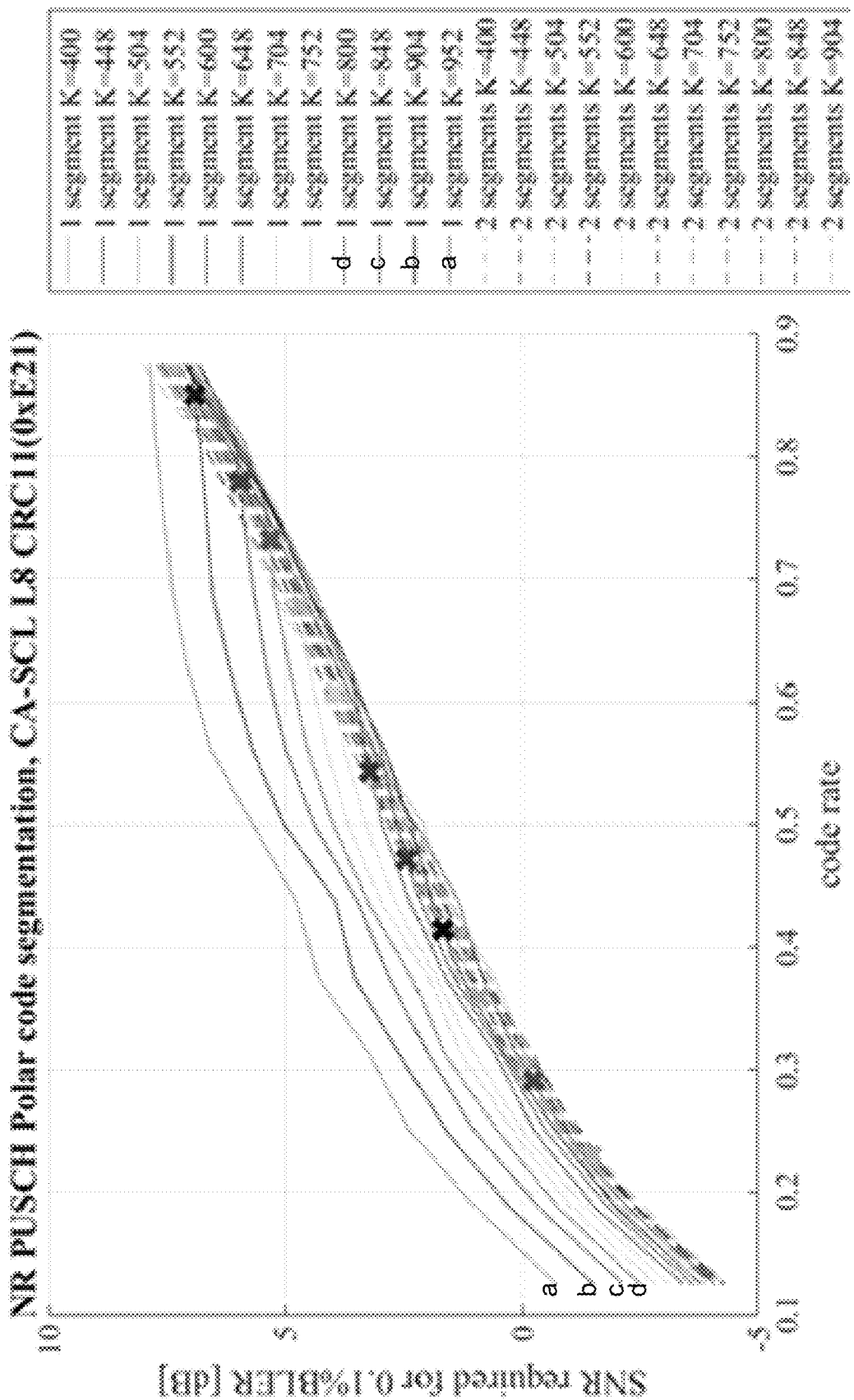
FIG. 11 is a diagram illustrating a comparison of performance between segmented and non-segmented NR polar code blocks, in connection with various aspects discussed herein.

Referring to FIG. 11, illustrated is a graph showing a comparison of performance between segmented and non-segmented NR polar code blocks, in connection with various aspects discussed herein. FIG. 11 shows that for a given NR polar code design value of code rate R, where a segmented code block achieves better performance than a non-segmented code block varies with payload size K. In FIG. 11, the crosses indicate points of intersection of performance between the segmented and non-segmented code blocks for associated values of K.

Figure 12:
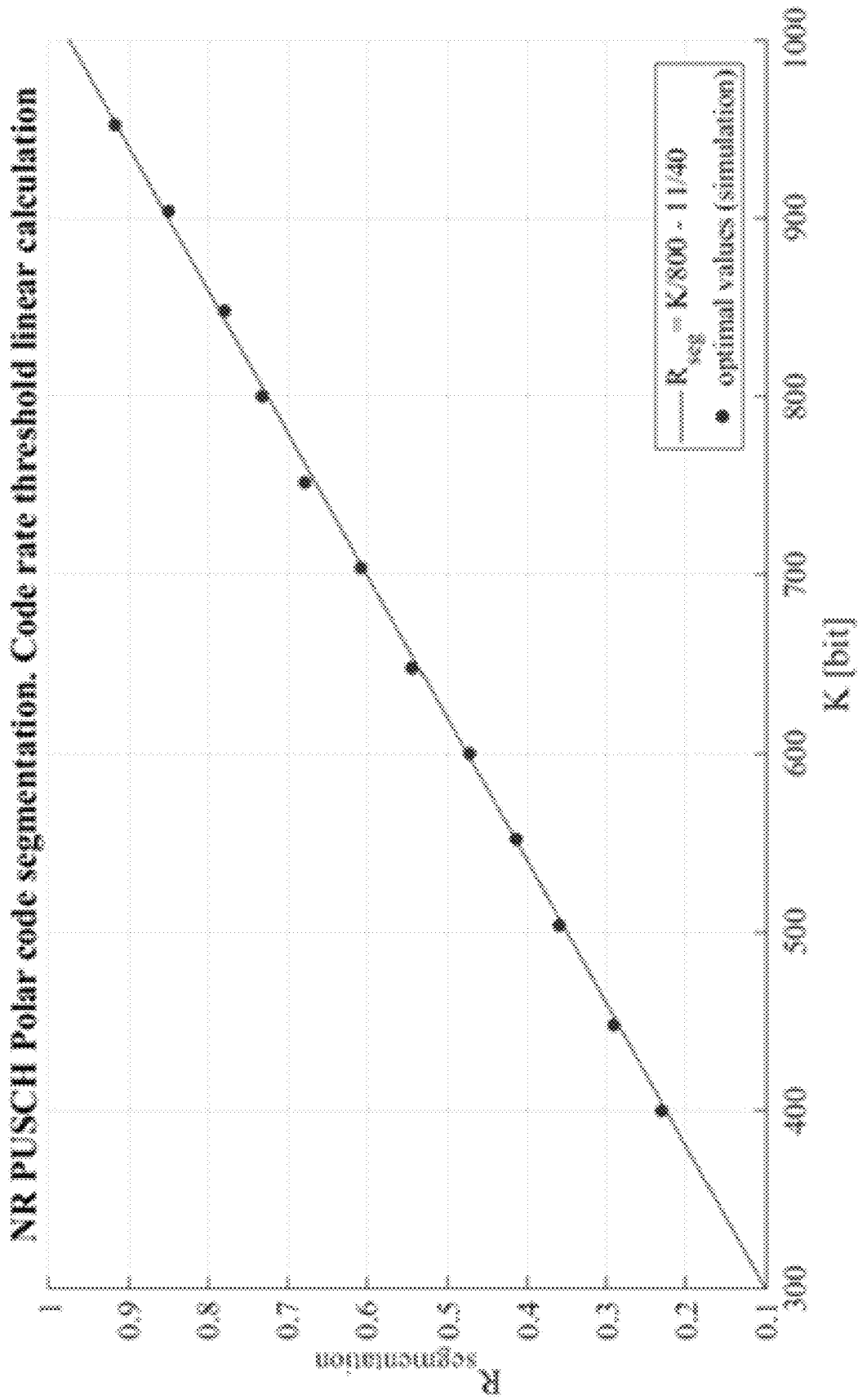
FIG. 12 is a diagram illustrating the linear dependency between the code rate threshold $R_{seg}$ and payload size K for NR polar codes, in connection with various aspects discussed herein.

Referring to FIG. 12, illustrated is a graph showing the linear dependency between the code rate threshold $R_{seg}$ and payload size K for NR polar codes, in connection with various aspects discussed herein. As can be seen in FIG. 12, the optimal value of the code rate threshold $R_{seg}$ depends linearly on the payload size K.

Figure 13:
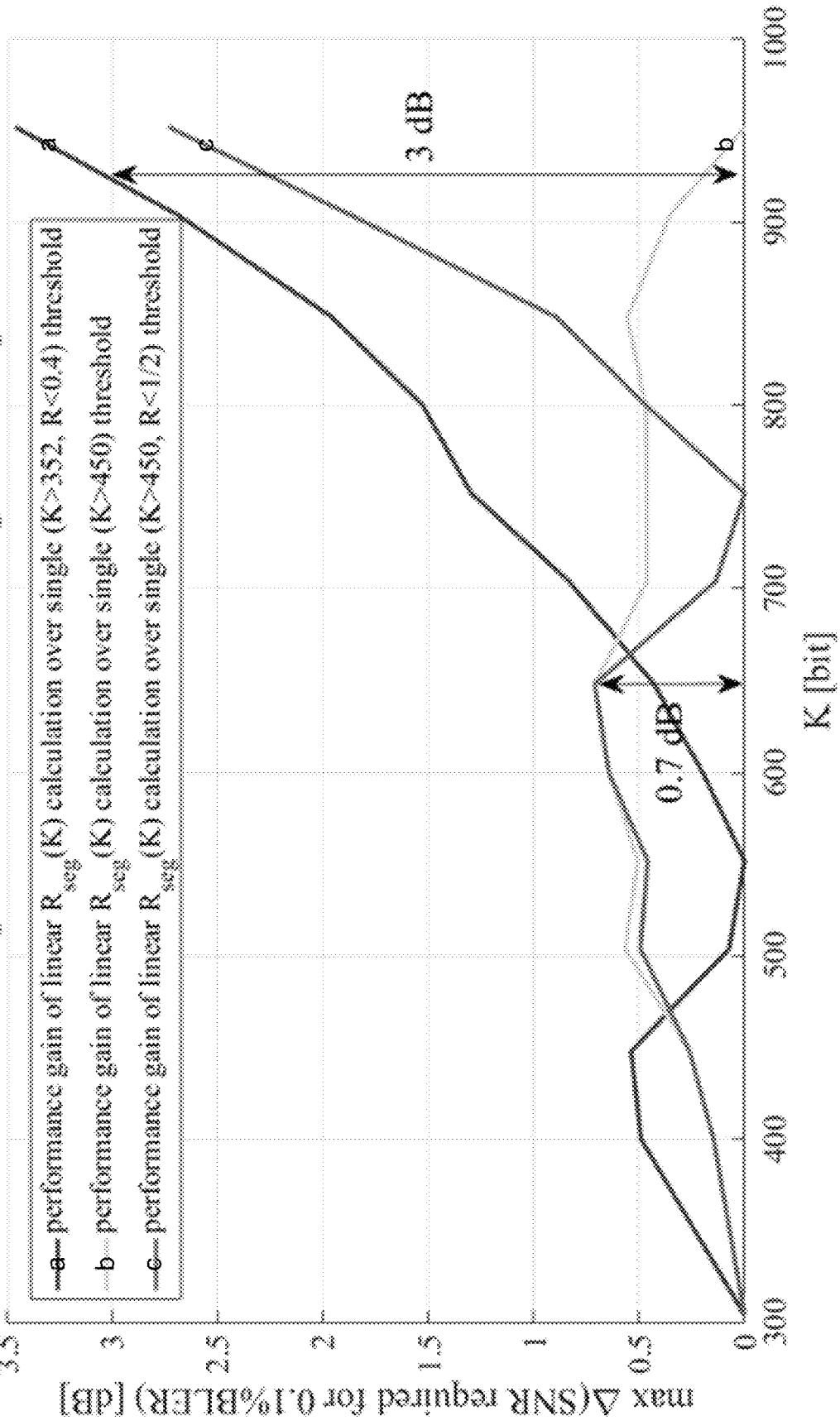
FIG. 13 is a diagram illustrating an example of the performance gain which can be obtained via code block segmentation based on thresholds from linear formulae as compared to constant thresholds, according to various aspects discussed herein.

Accordingly, in various embodiments of the second set of aspects, linear formulae can be employed (e.g., by processor(s) 410 or processor(s) 510) to calculate code block segmentation threshold value(s) based on a current payload size and/or code rate, and to apply (e.g., via processor(s) 410 or processor(s) 510) code block segmentation based on the calculated threshold value(s) (e.g., apply segmentation for $K > K_{seg}$ and $R < R_{seg}$). Referring to FIG. 13, illustrated is a graph showing an example of the performance gain which can be obtained via code block segmentation based on thresholds from linear formulae as compared to constant thresholds, according to various aspects discussed herein.

In alternative embodiments employing the second set of aspects, thresholds can be based on only the block size, such as applying (e.g., via processor(s) 410 or processor(s) 510) segmentation when the payload size $K > K_{seg}$, where $K_{seg}$ is a constant (e.g., $K_{seg}$=450, etc.).

In some embodiments employing the second set of aspects, segmentation can be applied (e.g., by processor(s) 410 or processor(s) 510) when R<$R_{seg}$, where $R_{seg}$ is a linear function of K for positive values of K (e.g., $R_{seg}$(K)=max (K/800−11/40, 0)), where K is the payload size.

Coded Bit Interleaving of Segments

Figure 14:
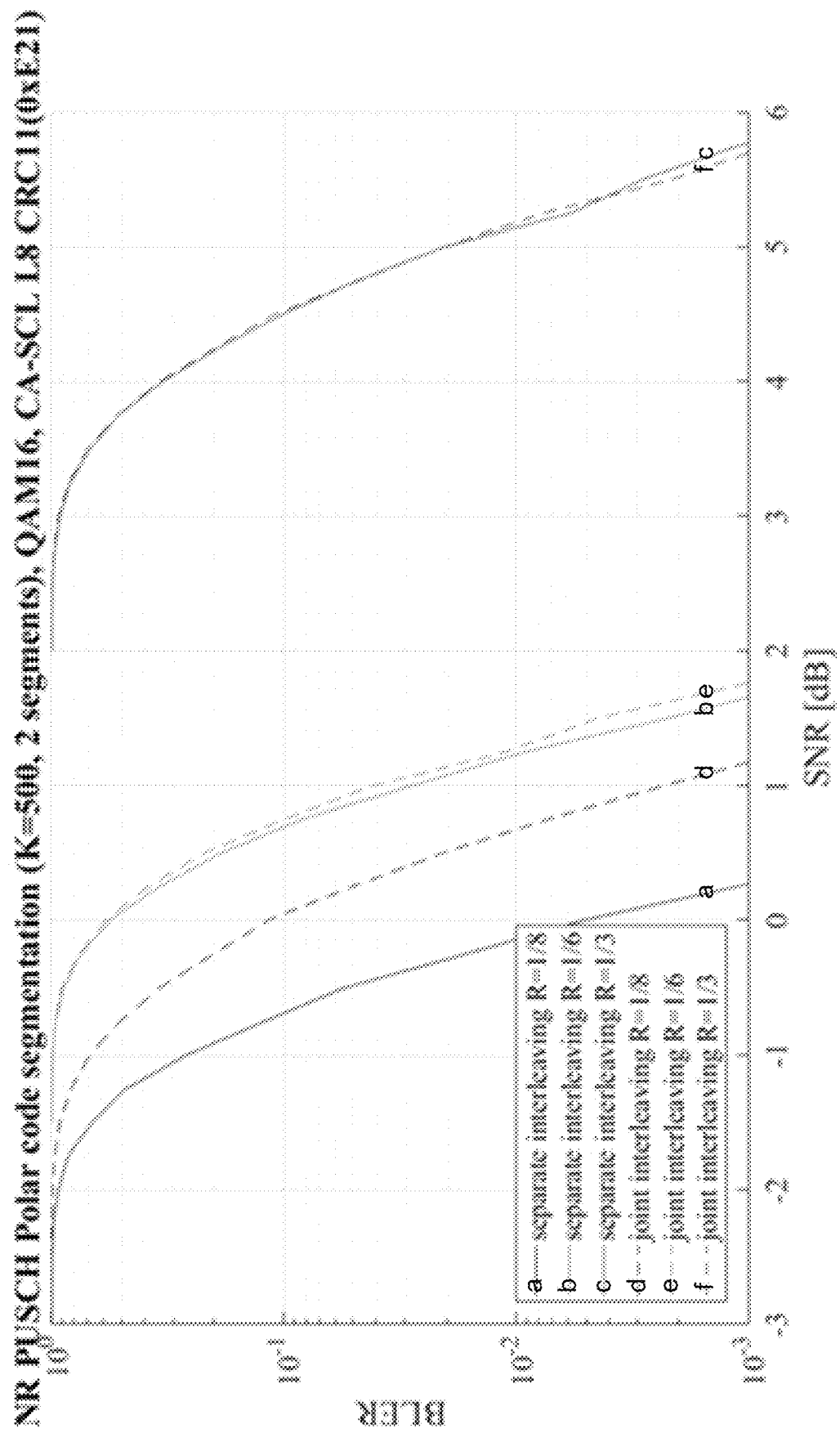
FIG. 14 is a diagram illustrating performance for joint interleaving compared to separate interleaving for segments, in connection with various aspects discussed herein.

Referring to FIG. 14, illustrated is a graph showing performance for joint interleaving compared to separate interleaving for segments, in connection with various aspects discussed herein. As can be seen in FIG. 14, in most scenarios, separate interleaving (e.g., by processor(s) 410 or processor(s) 510) performs better than joint interleaving (e.g., by processor(s) 410 or processor(s) 510). When the segments are concatenated and interleaver together (e.g., by processor(s) 410 or processor(s) 510) with a single big common triangle, each segment can be located in some part of the triangle (e.g., the first segment in the top part and the second segment in the bottom part), and this part looks more like a rectangle for the first segment. Thus, the first segment can be interleaved almost like in a simple block interleaver, which has poor performance with polar codes. Therefore, in various aspects, each segment can be interleaved separately (e.g., by processor(s) 410 or processor(s) 510). Separate interleaving (e.g., by processor(s) 410 or processor(s) 510) also helps with efficient deinterleaving (e.g., by processor(s) 510 or processor(s) 410, respectively) and potential parallel processing (e.g., by processor(s) 410 or processor(s) 510). In various such embodiments, each segment can be interleaved (e.g., by processor(s) 410 or processor(s) 510) with a separate triangular interleaver.

RE-Level Vs. Bit-Level Mixing of Segments

Figure 15:
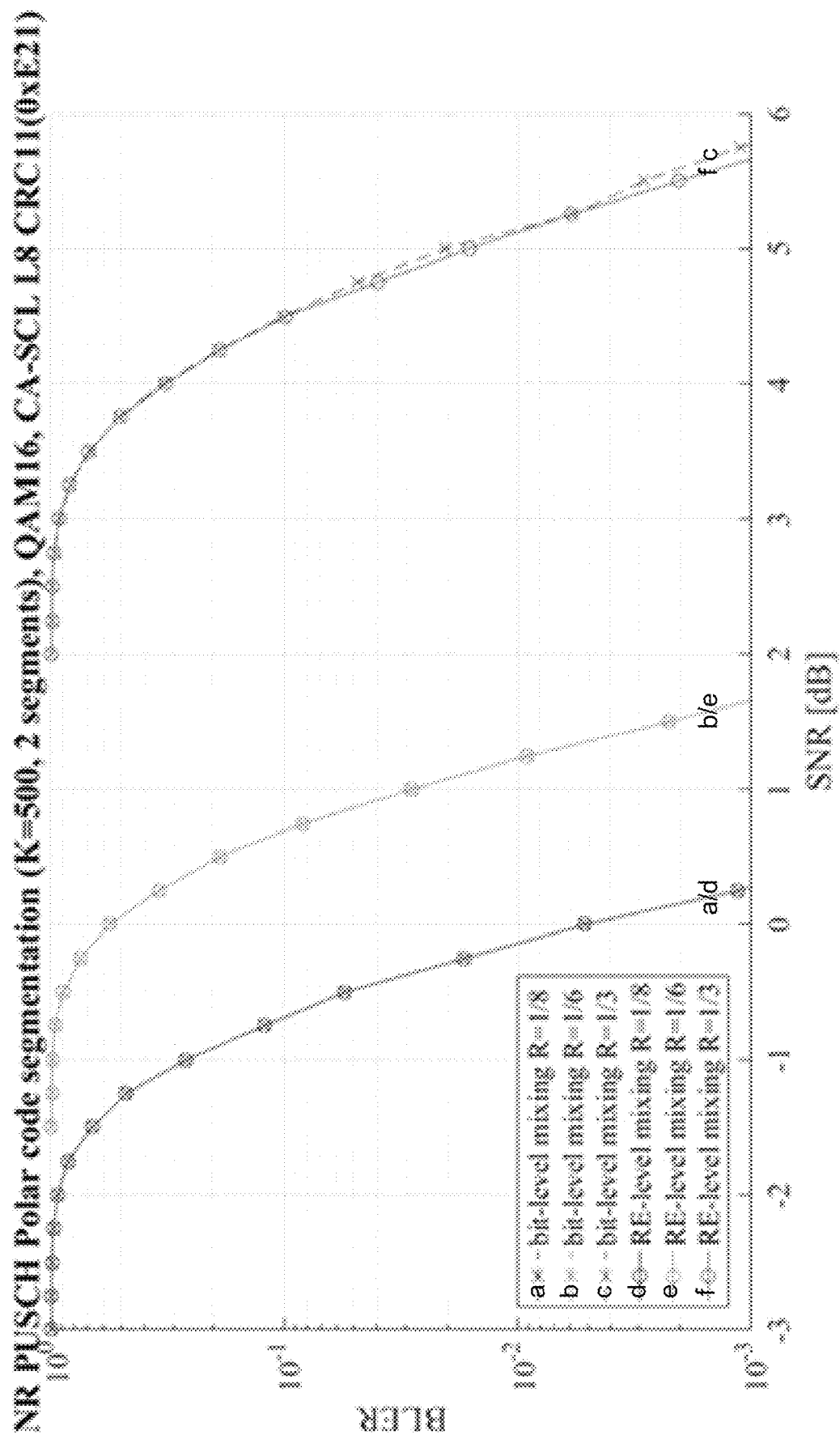
FIG. 15 is a diagram illustrating performance for bit-level mixing of polar code segments compared to RE (Resource Element)-level mixing of polar code segments, in connection with various aspects discussed herein.

Referring to FIG. 15, illustrated is a graph showing performance for bit-level mixing of polar code segments compared to RE (Resource Element)-level mixing of polar code segments, in connection with various aspects discussed herein. As can be seen in FIG. 15, RE (Resource Element)-level mixing is generally sufficient, and bit-level mixing does not provide significant advantages. In various embodiments of the second set of aspects, a modulation symbol (e.g., generated by processor(s) 410 or processor(s) 510) can comprise coded bits from a single segment.

Complexity Reduction for Triangular Interleaver

When UCI (Uplink Control Information) is multiplexed (e.g., by processor(s) 410 and transceiver circuitry 420) into the PUSCH (Physical Uplink Shared Channel) resources, the number of coded bits can become very large. For example, when the polar circular buffer rate-matching operation is limited to a maximum coded bits of $N_{max}$ (e.g., with $N_{max}$=1024), the bit-level channel interleaver for polar can be significantly larger, for example, as big as 237600 bits=14*3300*6, implying a triangle size of ~700×700. Such interleaving operations can lead to increased area and implementation complexity (e.g., at system 400), especially if the UCI multiplexing (e.g., via processor(s) 410 and transceiver circuitry 420) supports the stringent processing requirements (e.g., $N^2$ values).

For typical UCI payload sizes of ~500 bits (per segment), with a reasonably low coding rate such as 1/8 ($R_{min}$ for Polar), the maximum number of coded bits would be around 4000 bits. Thus, in various embodiments, a maximum interleaver size of around a threshold value (e.g., 4096, etc.) can be applied on the interleaver span. Beyond that, the interleaving pattern can be repeated (e.g., by processor(s) 410), which can be performed in a variety of ways, depending on the particular embodiment.

For example, in various embodiments employing the second set of aspects, the uplink interleaver can be applied (e.g., by processor(s) 410) after the rate matching functionality and prior to repetition, the maximum interleaver span (e.g., applied by processor(s) 410) can be limited to the threshold value (e.g., 4096, etc.) for a segment, and circular repetition can be employed (e.g., by processor(s) 410) when the number of coded bits exceeds the threshold value (e.g., 4096, etc.).

Alternatively, other embodiments can allow lower coding rates, but only limit the maximum span of the interleaver (e.g., applied by processor(s) 410). Alternatively, implementation-based solutions or alternatives (e.g., that apply an upper limit on the maximum number of coded bits per segment for UCI to be 4096 bits) could also be employed; however, these involve significant increased complexity due to large triangles compared to placing the interleaver prior to repetition.

In various embodiments employing the second set of aspects, the interleaver (e.g., uplink interleaver of system 400) can be placed after the rate matching functionality and prior to repetition. Additionally, in various such embodiments, a maximum interleaver span (e.g., 4096, etc.) can be applied (e.g., by processor(s) 410) for a segment. In aspects wherein the number of coded bits exceeds the maximum (e.g., 4096), circular repetition can be employed (e.g., by processor(s) 410).

Additional Embodiments

Figure 16:
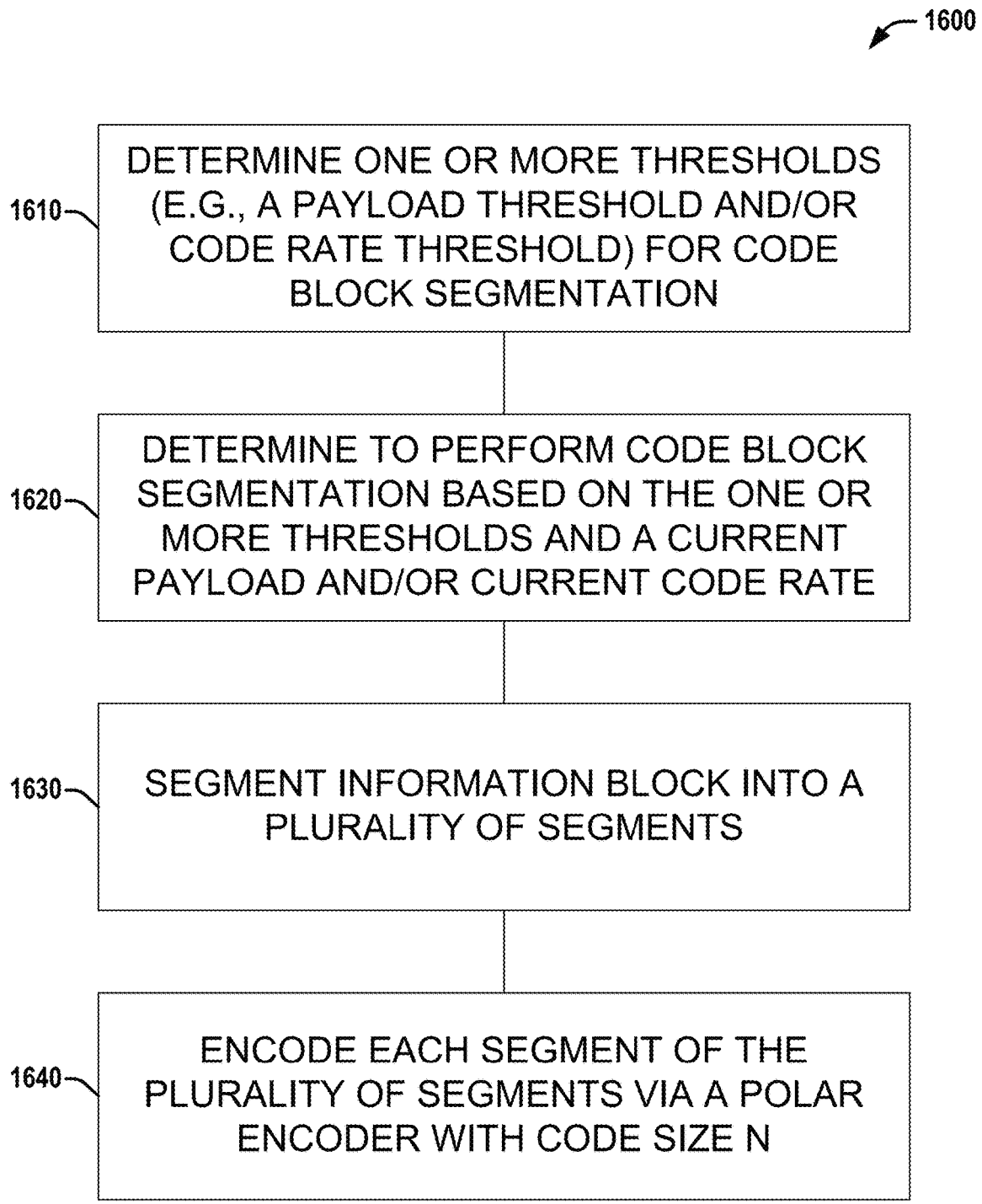
FIG. 16 is a flow diagram of an example method employable at a UE that facilitates polar coding of a NR (New Radio) UL (Uplink) channel, according to various aspects discussed herein.

Referring to FIG. 16, illustrated is a flow diagram of an example method 1600 employable at a UE that facilitates polar coding of a NR (New Radio) UL (Uplink) channel, according to various aspects discussed herein. In other aspects, a machine readable medium can store instructions associated with method 1600 that, when executed, can cause a UE to perform the acts of method 1600.

At 1610, one or more thresholds (e.g., a payload threshold (Kseg) and/or a code rate threshold (Rseg)) can be determined for code block segmentation.

At 1620, a determination can be made to perform code block segmentation based on the one or more thresholds and at least one of a current payload (K) of an information block or a current code rate (R) for the information block.

At 1630, the information block can be segmented into a plurality of segments.

At 1640, each segment of the plurality of segments can be encoded via a polar encoder with a code size (N).

Additionally or alternatively, method 1600 can include one or more other acts described herein in connection with various embodiments of system 600 discussed herein.

Figure 17:
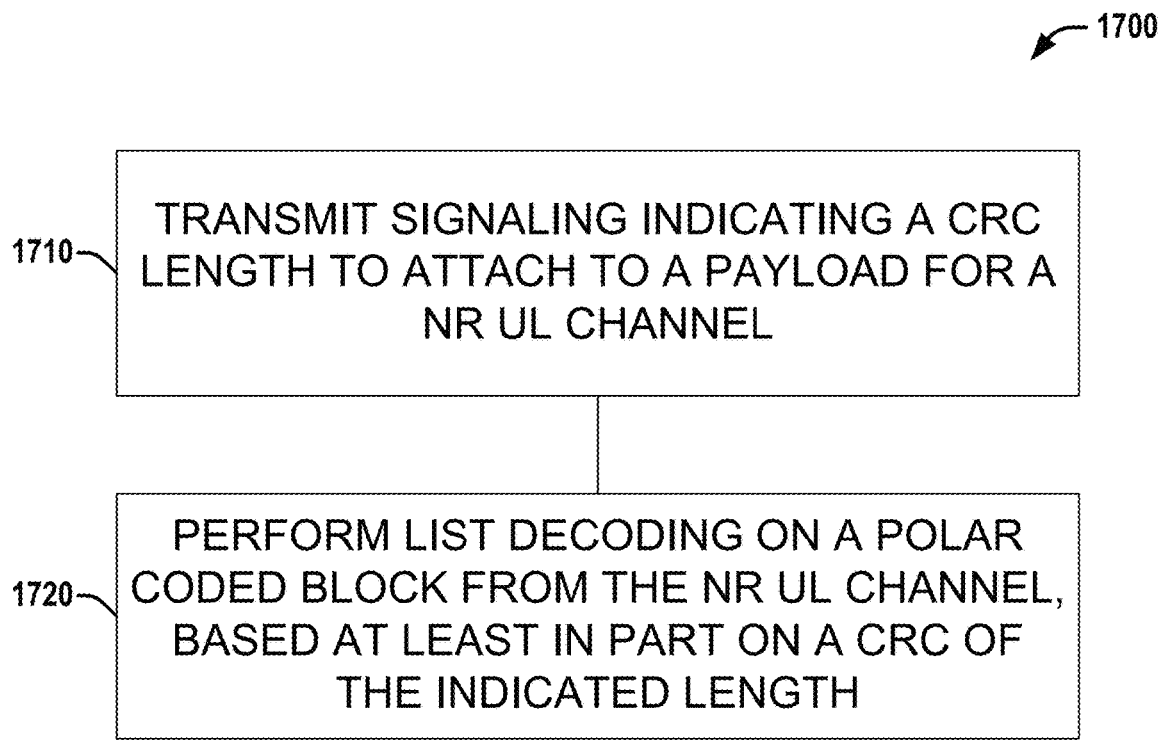
FIG. 17 is a flow diagram of an example method employable at a BS that facilitates decoding of a polar coded NR (New Radio) UL (Uplink) channel, according to various aspects discussed herein.

Referring to FIG. 17, illustrated is a flow diagram of an example method 1700 employable at a BS that facilitates decoding of a polar coded NR (New Radio) UL (Uplink) channel, according to various aspects discussed herein. In other aspects, a machine readable medium can store instructions associated with method 1700 that, when executed, can cause a BS (e.g., eNB, gNB, etc.) to perform the acts of method 1700.

At 1710, signaling (e.g., NR physical layer or NR higher layer signaling) can be transmitted that indicates a CRC (Cyclic Redundancy Check) length to attach to a payload for a NR (New Radio) UL (Uplink) channel.

At 1720, list decoding can be performed on a polar coded block (e.g., based in part on a CRC (of the indicated length) of the coded block) from the NR UL channel to obtain an information block or a segment of an information block.

Additionally or alternatively, method 1700 can include one or more other acts described herein in connection with various embodiments of system 500 discussed herein.

A first example embodiment employable in connection with the first set of aspects discussed herein can comprise a method or an apparatus configured to employ the method, the method comprising: acquiring (e.g., via processor(s) 410 or processor(s) 510) an information block of a first size (K), determining (e.g., via processor(s) 410 or processor(s) 510) that the first size exceeds a first threshold ($K_T$); segmenting (e.g., via processor(s) 410 or processor(s) 510) the information block in to a plurality of segments, each segment having a size less than or equal to the first threshold, encoding (e.g., via processor(s) 410 or processor(s) 510) each segment using a polar encoder of a code size (N); and transmitting (e.g., via transceiver circuitry 420 or communication circuitry 520) the encoded segments over a channel (e.g., an uplink control channel, such as NR PDCCH (Physical Downlink Control Channel)).

In various aspects of the first example embodiment employable in connection with the first set of aspects, the code size can be N=1024.

In various aspects of the first example embodiment employable in connection with the first set of aspects, the first threshold ($K_T$) can be 256.

A second example embodiment employable in connection with the first set of aspects discussed herein can comprise a method of or an apparatus configured to employ the method, the method comprising: acquiring (e.g., via processor(s) 410 or processor(s) 510) a first CRC (Cyclic Redundancy Check) length based on a signaling (e.g., generated by processor(s) 510, transmitted via communication circuitry 520, received via transceiver circuitry 420, and processed by processor(s) 410); encoding (e.g., via processor(s) 410 or processor(s) 510) data based on a CRC code of first CRC length to obtain a CRC coded data; encoding (e.g., via processor(s) 410 or processor(s) 510) the CRC coded data using a polar encoder to obtain a codeword; rate-matching (e.g., via processor(s) 410 or processor(s) 510) the codeword to obtain a subset of the codeword; and transmitting (e.g., via transceiver circuitry 420 or communication circuitry 520) the subset of codeword over a channel (e.g., an uplink control channel, such as NR PDCCH (Physical Downlink Control Channel)).

In various aspects of the second example embodiment employable in connection with the first set of aspects, the first CRC length can be associated with a list size of a decoder.

In various aspects of the second example embodiment employable in connection with the first set of aspects, the signaling can be NR higher layer signaling or NR physical layer signaling (e.g., generated by processor(s) 510, transmitted via communication circuitry 520, received via transceiver circuitry 420, and processed by processor(s) 410).

In various aspects of the second example embodiment employable in connection with the first set of aspects, signaling can be associated with a control resource set (e.g., generated by processor(s) 510, transmitted via communication circuitry 520, received via transceiver circuitry 420, and processed by processor(s) 410).

A first example embodiment employable in connection with the second set of aspects discussed herein can comprise a method of or an apparatus configured to employ the method, the method comprising: determine (e.g., via processor(s) 410 or processor(s) 510) at least one threshold value for code block segmentation, wherein the at least one threshold value comprises one or more of a threshold payload size $K_{seg}$ for code block segmentation or a threshold code rate $R_{seg}$ for code block segmentation; and determine (e.g., via processor(s) 410 or processor(s) 510) whether to employ code block segmentation based on the at least one threshold value and one or more of a current payload size K or a current code rate R.

In various aspects of the first example embodiment employable in connection with the second set of aspects, code block segmentation can be performed (e.g., via processor(s) 410 or processor(s) 510) when $K>K_{seg}$ In various aspects of the first example embodiment employable in connection with the second set of aspects, code block segmentation (e.g., via processor(s) 410 or processor(s) 510) performed when $R<R_{seg}$.

In various aspects of the first example embodiment employable in connection with the second set of aspects, the payload threshold can be determined (e.g., via processor(s) 410 or processor(s) 510) as $K_{seg}=C_K$, where $C_K$ is a constant. In various such aspects, the payload threshold can be, for example, $C_K=448$, $C_K=504$, or $C_K=554$.

In various aspects of the first example embodiment employable in connection with the second set of aspects, the code rate threshold can be determined (e.g., via processor(s) 410 or processor(s) 510) as $R_{seg}=C_R$, where $C_R$ is a constant. In various such aspects, the code rate threshold can be, for example, $C_R=1/2$, $C_R=3/4$, or $C_R=1$.

In various aspects of the first example embodiment employable in connection with the second set of aspects, the code rate threshold can be determined (e.g., by processor(s) 410 or processor(s) 510) from the current payload K based on a linear relationship, $R_{seg}(K)=a_1K+b_1$. In various such aspects, $a_1$ can be 1/800 and $b_1$ can be −11/40.

In various aspects of the first example embodiment employable in connection with the second set of aspects, the payload threshold can be determined (e.g., by processor(s) 410 or processor(s) 510) from the current code rate R based on a linear relationship, $K_{seg}(R)=a_2R+b_2$.

Example 1 is an apparatus configured to be employed in a UE (User Equipment), comprising: a memory interface; and processing circuitry configured to: determine one or more thresholds for code block segmentation, wherein the one or more thresholds for code block segmentation comprise one or more of a payload threshold ($K_{seg}$) or a code rate threshold ($R_{seg}$); determine to perform code block segmentation based on the one or more thresholds and at least one of a current payload (K) of an information block or a current code rate (R) for the information block; segment the information block into a plurality of segments; encode each segment of the plurality of segments via a polar encoder with a code size (N); and send the one or more thresholds for code block segmentation to a memory via the memory interface.

Example 2 comprises the subject matter of any variation of any of example(s) 1, wherein the code size (N) is one of 64, 128, 256, 512, or 1024.

Example 3 comprises the subject matter of any variation of any of example(s) 1, wherein the processing circuitry is further configured to generate an associated coded block from each of the segments via one of repetition or puncturing, wherein the size of each associated coded block is one of 72, 144, 288, or 576.

Example 4 comprises the subject matter of any variation of any of example(s) 1, wherein the one or more thresholds comprise the payload threshold ($K_{seg}$), and wherein the processing circuitry is configured to determine to perform code block segmentation based on the current payload (K) being larger than the payload threshold ($K_{seg}$).

Example 5 comprises the subject matter of any variation of any of example(s) 1, wherein the one or more thresholds comprise the code rate threshold ($R_{seg}$), and wherein the processing circuitry is configured to determine to perform code block segmentation based on the current code rate (R) being less than the code rate threshold ($R_{seg}$).

Example 6 comprises the subject matter of any variation of any of example(s) 1, wherein each threshold of the one or more thresholds is a constant.

Example 7 comprises the subject matter of any variation of any of example(s) 1-6, wherein the processing circuitry is further configured to map each segment of the plurality of segments to a NR (New Radio) PUCCH (Physical Uplink Control Channel) or a NR PUSCH (Physical Uplink Shared Channel).

Example 8 comprises the subject matter of any variation of any of example(s) 1-6, wherein the processing circuitry is further configured to separately interleave each segment of the plurality of segments via a triangular interleaver.

Example 9 comprises the subject matter of any variation of any of example(s) 8, wherein the triangular interleaver has a maximum interleaver span of 4096.

Example 10 comprises the subject matter of any variation of any of example(s) 8, wherein the processing circuitry is further configured to employ circular repetition of an interleaving pattern when a number of coded bits associated with a segment of the plurality of segments exceeds a maximum interleaver span of the triangular interleaver.

Example 11 is an apparatus configured to be employed in a gNB (next generation Node B), comprising: a memory interface; and processing circuitry configured to: generate signaling indicating a CRC (Cyclic Redundancy Check) length to attach to a payload for a NR (New Radio) channel, wherein the signaling comprises one or more of NR physical layer signaling or NR higher layer signaling; perform list decoding on an UL (Uplink) coded block encoded via polar coding from the NR channel to obtain an information block or a segment of an information block, wherein the list decoding is performed based at least in part on an associated CRC of the polar coded block, wherein the associated CRC has the CRC length; and send the information block or the segment of the information block to a memory via the memory interface.

Example 12 comprises the subject matter of any variation of any of example(s) 11, wherein the processing circuitry is further configured to generate a control resource set that comprises the signaling.

Example 13 comprises the subject matter of any variation of any of example(s) 11, wherein a code size (N) associated with the coded block is one of 64, 128, 256, 512, or 1024.

Example 14 comprises the subject matter of any variation of any of example(s) 11-13, wherein the NR channel is a NR (New Radio) PUCCH (Physical Uplink Control Channel) or a NR PUSCH (Physical Uplink Shared Channel).

Example 15 comprises the subject matter of any variation of any of example(s) 11-13, wherein the processing circuitry is configured to generate the signaling indicating the CRC length in response to an UL message that indicates a decoding capability of a UE.

Example 16 is a machine readable medium comprising instructions that, when executed, cause a UE (User Equipment) to: determine one or more thresholds for code block segmentation, wherein the one or more thresholds for code block segmentation comprise one or more of a payload threshold ($K_{seg}$) or a code rate threshold ($R_{seg}$); determine whether to perform code block segmentation based on the one or more thresholds and at least one of a current payload (K) of an information block or a current code rate (R) for the information block; segment the information block into a plurality of segments in response to a positive determination to perform code block segmentation; encode each segment of the plurality of segments via a polar encoder with a code size (N) in response to the positive determination to perform code block segmentation, or encode the information block via the polar encoder in response to a negative determination to perform code block segmentation; and transmit each segment of the plurality of segments via a NR (New Radio) PUCCH (Physical Uplink Control Channel) or a NR PUSCH (Physical Uplink Shared Channel).

Example 17 comprises the subject matter of any variation of any of example(s) 16, wherein the one or more thresholds comprise the payload threshold ($K_{seg}$), and wherein the payload threshold ($K_{seg}$) is a constant.

Example 18 comprises the subject matter of any variation of any of example(s) 17, wherein the payload threshold ($K_{seg}$) is at least 256 and at most 554.

Example 19 comprises the subject matter of any variation of any of example(s) 16, wherein the one or more thresholds comprise the code rate threshold ($R_{seg}$), and wherein the code rate threshold ($R_{seg}$) is a constant.

Example 20 comprises the subject matter of any variation of any of example(s) 19, wherein the code rate threshold ($R_{seg}$) is at least 1/2 and at most 1.

Example 21 comprises the subject matter of any variation of any of example(s) 16-18, wherein the one or more thresholds comprise the code rate threshold ($R_{seg}$), and wherein the code rate threshold ($R_{seg}$) is a linear function of the current payload (K), $R_{seg}(K)=a_1 K+b_1$, wherein $a_1$ and $b_1$ are constants.

Example 22 comprises the subject matter of any variation of any of example(s) 21, wherein $a_1=1/800$ and $b_1=-11/40$.

Example 23 comprises the subject matter of any variation of any of example(s) 22, wherein the one or more thresholds comprise the payload threshold ($K_{seg}$), and wherein the payload threshold ($K_{seg}$) is a linear function of the current code rate (R), $K_{seg}(R)=a_2 R+b_2$, wherein $a_2$ and $b_2$ are constants.

Example 24 is a machine readable medium comprising instructions that, when executed, cause a gNB (next generation Node B) to: transmit signaling indicating a CRC (Cyclic Redundancy Check) length for attachment to a payload for a NR (New Radio) channel, wherein the signaling comprises one or more of NR physical layer signaling or NR higher layer signaling; and perform list decoding on an UL (Uplink) coded block encoded via polar coding from the NR channel to obtain an information block or a segment of an information block, wherein the list decoding is performed based at least in part on an associated CRC of the polar coded block, wherein the associated CRC has the CRC length.

Example 25 comprises the subject matter of any variation of any of example(s) 24, wherein the signaling is part of a control resource set generated by the gNB.

Example 26 comprises the subject matter of any variation of any of example(s) 24, wherein a code size (N) associated with the coded block is one of 64, 128, 256, 512, or 1024.

Example 27 comprises the subject matter of any variation of any of example(s) 24-26, wherein the NR channel is a NR (New Radio) PUCCH (Physical Uplink Control Channel) or a NR PUSCH (Physical Uplink Shared Channel).

Example 28 comprises the subject matter of any variation of any of example(s) 24-26, wherein the instructions, when executed, further cause the gNB to generate the signaling indicating the CRC length in response to an UL message that indicates a decoding capability of a UE.

Example 29 comprises an apparatus comprising means for executing any of the described operations of examples 1-28.

Example 30 comprises a machine readable medium that stores instructions for execution by a processor to perform any of the described operations of examples 1-28.

Example 31 comprises an apparatus comprising: a memory interface; and processing circuitry configured to: perform any of the described operations of examples 1-28.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations. In addition, while a particular feature may have been disclosed with respect to only one of several implementations, such feature may be combined with one or more other features of the other implementations as may be desired and advantageous for any given or particular application.

What is claimed is:

1. An apparatus configured to be employed in a UE (User Equipment), comprising:
    a memory interface; and
    processing circuitry configured to:
        determine one or more thresholds for code block segmentation, wherein the one or more thresholds for code block segmentation comprise one or more of a payload threshold ($K_{seg}$) or a code rate threshold ($R_{seg}$);
        determine to perform code block segmentation based on the one or more thresholds and a current payload (K) of an information block and a current code rate (R) for the information block;
        segment the information block into a plurality of segments;
        encode each segment of the plurality of segments via a polar encoder with a code size (N); and
        send the one or more thresholds for code block segmentation to a memory via the memory interface.

2. The apparatus of claim 1, wherein the code size (N) is one of 64, 128, 256, 512, or 1024.

3. The apparatus of claim 1, wherein the processing circuitry is further configured to generate an associated coded block from each of the plurality of segments via one of repetition or puncturing, wherein a size of each block of the associated coded block is one of 72, 144, 288, or 576.

4. The apparatus of claim 1, wherein the one or more thresholds comprise the payload threshold ($K_{seg}$), and wherein the processing circuitry is configured to determine to perform code block segmentation based on the current payload (K) being larger than the payload threshold ($K_{seg}$).

5. The apparatus of claim 1, wherein the one or more thresholds comprise the code rate threshold ($R_{seg}$), and wherein the processing circuitry is configured to determine to perform code block segmentation based on the current code rate (R) being less than the code rate threshold ($R_{seg}$).

6. The apparatus of claim 1, wherein each threshold of the one or more thresholds is a constant.

7. The apparatus of claim 1, wherein the processing circuitry is further configured to map each segment of the plurality of segments to a NR (New Radio) PUCCH (Physical Uplink Control Channel) or a NR PUSCH (Physical Uplink Shared Channel).

8. The apparatus of claim 1, wherein the processing circuitry is further configured to interleave each segment of the plurality of segments via a triangular interleaver.

9. The apparatus of claim 8, wherein the triangular interleaver has a maximum interleaver span of 4096.

10. The apparatus of claim 8, wherein the processing circuitry is further configured to employ circular repetition of an interleaving pattern when a number of coded bits associated with a segment of the plurality of segments exceeds a maximum interleaver span of the triangular interleaver.

11. A non-transitory machine readable medium comprising instructions that, when executed, cause a UE (User Equipment) to:
    determine one or more thresholds for code block segmentation, wherein the one or more thresholds for code block segmentation comprise one or more of a payload threshold ($K_{seg}$) or a code rate threshold ($R_{seg}$);
    determine whether to perform code block segmentation based on the one or more thresholds and a current payload (K) of an information block and a current code rate (R) for the information block;
    segment the information block into a plurality of segments in response to a positive determination to perform code block segmentation;
    encode each segment of the plurality of segments via a polar encoder with a code size (N) in response to the positive determination to perform code block segmentation, or encode the information block via the polar encoder in response to a negative determination to perform code block segmentation; and
    transmit each segment of the plurality of segments via a NR (New Radio) PUCCH (Physical Uplink Control Channel) or a NR PUSCH (Physical Uplink Shared Channel).

12. The non-transitory machine readable medium of claim 11, wherein the one or more thresholds comprise the payload threshold ($K_{seg}$), and wherein the payload threshold ($K_{seg}$) is a constant.

13. The non-transitory machine readable medium of claim 12, wherein the payload threshold ($K_{seg}$) is at least 256 and at most 554.

14. The non-transitory machine readable medium of claim 11, wherein the one or more thresholds comprise the code rate threshold ($R_{seg}$), and wherein the code rate threshold ($R_{seg}$) is a constant.

15. The non-transitory machine readable medium of claim 14, wherein the code rate threshold ($R_{seg}$) is at least 1/2 and at most 1.

16. The non-transitory machine readable medium of claim 11, wherein the one or more thresholds comprise the code rate threshold ($R_{seg}$), and wherein the code rate threshold ($R_{seg}$) is a linear function of the current payload (K), wherein $R_{seg}$ is defined by $R_{seg}(K)=a_1 K+b_1$, wherein $a_1$ and $b_1$ are constants.

17. The non-transitory machine readable medium of claim 16, wherein $a_1=1/800$ and $b_1=-11/40$.

18. The non-transitory machine readable medium of claim 17, wherein the one or more thresholds comprise the payload threshold ($K_{seg}$), and wherein the payload threshold ($K_{seg}$) is a linear function of the current code rate (R), wherein $K_{seg}$ is defined by $K_{seg}(R)=a_2 R+b_2$, wherein $a_2$ and $b_2$ are constants.

* * * * *